(12) United States Patent
Hu

(10) Patent No.: US 9,100,597 B2
(45) Date of Patent: Aug. 4, 2015

(54) MULTI-SPECTRUM PHOTOSENSITIVE DEVICES AND METHODS FOR SAMPLING THE SAME

(75) Inventor: Xiaoping Hu, Shenzhen (CN)

(73) Assignee: BOLY MEDIA COMMUNICATIONS (SHENZHEN) CO., LTD., Shenzhen (CN)

(*) Notice: Subject to any disclaimer, the term of this patent is extended or adjusted under 35 U.S.C. 154(b) by 319 days.

(21) Appl. No.: 13/699,525

(22) PCT Filed: Jun. 1, 2010

(86) PCT No.: PCT/CN2010/073443
§ 371 (c)(1),
(2), (4) Date: Nov. 21, 2012

(87) PCT Pub. No.: WO2011/150554
PCT Pub. Date: Dec. 8, 2011

(65) Prior Publication Data
US 2013/0068934 A1    Mar. 21, 2013

(51) Int. Cl.
*G01J 3/50* (2006.01)
*H04N 3/14* (2006.01)
(Continued)

(52) U.S. Cl.
CPC .......... *H04N 5/347* (2013.01); *H01L 27/14609* (2013.01); *H04N 5/359* (2013.01); *H04N 5/37457* (2013.01); *H04N 9/045* (2013.01)

(58) Field of Classification Search
CPC .......... G06T 3/4007; H04N 9/64; H04N 9/67; H04N 9/76; H04N 5/347
USPC ............................... 250/208.1, 226; 348/273
See application file for complete search history.

(56) References Cited

U.S. PATENT DOCUMENTS

| 7,417,670 | B1 | 8/2008 | Linzer et al. |
| 2001/0036359 | A1 | 11/2001 | Nishikawa et al. |

(Continued)

FOREIGN PATENT DOCUMENTS

| EP | 2172973 A1 | 4/2010 |
| JP | 2001-231003 A | 8/2001 |

(Continued)

*Primary Examiner* — Thanh Luu
(74) *Attorney, Agent, or Firm* — Knobbe Martens Olson & Bear LLP

(57) ABSTRACT

A multi-spectrum photosensitive device and method for sampling the same, the method includes a first combining process for combining-and-sampling two adjacent pixels in same row different column, or in different row same column, or in different row different column in the pixel array to obtain a sampling data of a first combined pixel; a second combining process for combining-and-sampling the sampling data of the first combined pixel obtained from the first combining unit to obtain a sampling data of a second combined pixel; and a third combining process, a sampling data of a third combined pixel is obtained by a method for color conversion and image scaling in a digital space. The application is applied for a multi-pixel sharing reading and amplifying circuit of a single-layer color photosensitive chip, a single-sided multi-layer photosensitive chip, and a double-sided double-layer photosensitive chip. In the basis of the spirit of the existing pixel reading circuit, the application has orders of magnitude breakthrough in principle, basic circuit and performance, and implements a YUV format output of a sub-sampling image in a photosensitive device at the same time of implementing sub-sampling with high performance.

18 Claims, 26 Drawing Sheets

(51) Int. Cl.
    *H04N 5/347* (2011.01)
    *H04N 5/359* (2011.01)
    *H04N 5/3745* (2011.01)
    *H04N 9/04* (2006.01)
    *H01L 27/146* (2006.01)

(56) References Cited

U.S. PATENT DOCUMENTS

| | | |
|---|---|---|
| 2005/0174454 A1 | 8/2005 | Ahn et al. |
| 2006/0274176 A1 | 12/2006 | Guidash |
| 2007/0268533 A1 | 11/2007 | Kijima et al. |
| 2008/0068475 A1 | 3/2008 | Choe et al. |
| 2009/0289169 A1 | 11/2009 | Yang et al. |
| 2010/0026865 A1 | 2/2010 | Tivarus et al. |
| 2010/0118167 A1 | 5/2010 | Johnson |
| 2010/0177226 A1* | 7/2010 | Itonaga et al. ............... 348/300 |
| 2010/0283866 A1 | 11/2010 | Numata |

FOREIGN PATENT DOCUMENTS

| | | |
|---|---|---|
| JP | 2004-215249 A | 7/2004 |
| JP | 2006-174325 A | 6/2006 |
| JP | 2008-289001 A | 11/2008 |
| JP | 2008-546313 A | 12/2008 |
| JP | 2009-159186 A | 7/2009 |
| JP | 2010-028781 A | 2/2010 |
| KR | 10-2005-0080814 A1 | 8/2005 |
| KR | 10-2008-0026001 A | 3/2008 |
| KR | 10-2010-0057599 A | 5/2010 |
| WO | WO 2009/038824 A1 | 3/2009 |

* cited by examiner (a)

(b)

MULTI-SPECTRUM PHOTOSENSITIVE DEVICES AND METHODS FOR SAMPLING THE SAME

CROSS-REFERENCE TO RELATED APPLICATIONS

This application is the U.S. National Phase under 35. U.S.C. §371 of International Application PCT/CN2010/073443, filed Jun. 1, 2010. The disclosures of the above-described application is hereby incorporated by reference in their entirety. The International Application was published under PCT Article 21(2) in a language other than English.

TECHNICAL FIELD

The application relates to reading photosensitive pixels in photosensitive chips, especially to reading sub-sampled data of photosensitive pixels in large-array photosensitive chips. In particular, the application relates to multi-spectrum photosensitive devices and methods for sampling the same.

BACKGROUND

The application is a continuation of applications titled "Multi-Spectrum Photosensitive Devices and Methods for Manufacturing the Same" (PCT/CN2007/071262), and "Multi-Spectrum Photosensitive Devices and Methods for Manufacturing the Same" (Chinese Application No. 200810217270.2) filed by the present inventor(s), and aims at providing more specific and preferable semiconductor circuit-level and chip-level implementations.

The previous photosensitive devices relate to sensing color visible lights or infrared, while seldom sensing both of them simultaneously. Although some other inventions or applications, such as a cadmium indium based semiconductor technology ("Silicon infrared focal plane arrays", M. Kimata, in Handbook of Infrared Detection Technologies, edited by M, Henini and M. Razeghi, pp. 352-392, Elsevier Science Ltd., 2002), may also be used to implement simultaneous photosensing for both invisible lights and infrared, but no color has been achieved. The previous methods for obtaining photosensitivity of color lights and infrared at the same time is to physically superimpose a color photosensitive device and a infrared photosensitive device together (such as, "Backside-hybrid Photodetector for trans-chip detection of NIR light", by T. Tokuda et al., in IEEE Workshop on Charge-coupled Devices & Advanced Image Sensors, Elmau, Germany, May 2003, and "A CMOS image sensor with eye-safe detection function backside carrier injection", T. Tokuda et al., J. Inst Image Information & Television Eng., 60(3): 366-372, March 2006).

A new method for manufacturing multi-spectrum photosensitive device in order to obtain color and infrared images simultaneously is proposed in the previous application titled "Multi-Spectrum Photosensitive Devices and Methods for Manufacturing the Same" (PCT/CN2007/071262), and "Multi-Spectrum Photosensitive Devices and Methods for Manufacturing the Same" (China Application No. 200810217270.2) filed by the present inventor. In the new-type photosensitive devices, dynamic photosensitive ranges of photosensitive devices are greatly expanded so as to meet high performance requirements in the fields of vehicles, security and surveillance etc. Furthermore, they can be used in small-sized color photosensitive devices, such as cell phone cameras, and the quality of image may be greatly enhanced. In addition, they can be manufactured by applying manufacturing technologies of existing CMOS, CCD, or other semiconductor photosensitive devices, and many effective manufacturing methods and structure designs can be used in these technologies. Some manufacturing methods using CMOS/CCD semiconductor technologies are provided in the present application.

However, a new problem brought from this new double-layer or multi-layer photosensitive device is that the data volume is two times or even more than that of conventional single-layer photosensitive devices. Although only half pixels may be needed to obtain the same resolution of double-layer photosensitive devices as that of single-layer photosensitive devices, processing large-array data in photosensitive devices at high speed remains a problem to be improved.

Recently, some excellent methods for sub-sampling large-array images with high performance, such as shared readout circuit, row binning and column binning sampling technologies are proposed in some applications, for example U.S. Pat. Nos. 6,801,258B1, 6,693,670B1, 7,091,466B2, 7,319,218B2 and etc. Among these applications, U.S. Pat. Nos. 6,693, 670B1, 7,091,466B2, and 7,319,218B2 are worth mentioning, which provide some effective and simple approaches to implement the binning of N columns or N rows, or that of M columns and N rows.

However, these technologies are still not optimal. For example, the signal-to-noise ratio (SNR) of image is only improved to $\sqrt{N}$ times by combining N points into one through using the row binning and column binning sub-sampling operations (see U.S. Pat. Nos. 7,091,466B2 and 7,319,218B2). This is because the signals are just averaged in the row and/or column binning operations, thereby decreasing the variance of random noise only by $\sqrt{N}$ times, while the useful signals themselves are not strengthened and are just substituted by the average value of several points. Moreover, there usually exist slowly-varying and low-frequency noise in image signals, which are not decreased neither.

In addition, the existing sub-sampling technologies only concern the requirements of sub-sampling of photosensitive chip arranged in Bayer pattern or CYMG pattern separately, and make no simplification in the post-sampling processing. For example, a color image of Bayer pattern remains to be an image of Bayer pattern by using the row binning and column binning sampling operations (see U.S. Pat. Nos. 7,091,466B2 and 7,319,218B2) employed by U.S. Micron Technologies Inc., and then to obtain YUV images which are preferred in preview and storage stages, complex processes are still required. While some other sub-sampling circuits can improve SNR, they need complex integrating circuits and comparators, thereby increasing auxiliary circuit and frequency.

Another significant limitation in existing sub-sampling technologies is that the row binning and column binning operations are only applied in pixels sensing the same color, wherein the pixels are not immediately contiguous in space (i.e., other pixels may be interposed therebetween). For Bayer patterns or CYMG color patterns, pixels of same color are not immediately contiguous in space, and the characteristic of uniform spatial distribution of original images has been damaged by the row binning and column binning operations. Therefore, the aliasing effects are easily generated in edges of lines if the backend processing is not specifically adapted to this situation.

In particular, for double-layer or multi-layer photosensitive devices to be concerned in the present application, the prior arts look quite awkward and mediocre because the double-layer or multi-layer photosensitive devices provide a lot excellent but totally new color pattern arrangements, for which both signal read out and sub-sampling should make use of the characteristics of the double-layer or multi-layer photosensitive devices so as to make improvements.

SUMMARY

Technical Problem

The object of the present application is to provide a more superior sub-sampling principle and an advanced sub-sampling circuit, and to optimize sub-sampling together with subsequent image processing. The present application provides a multi-spectrum photosensitive device and method for sampling the same to overcome the slight shortcoming of large amount of data inherent to a double-layer or multi-layer multi-spectrum photosensitive chip. Herein, the sampling method mainly includes sub-sampling, and but also includes full-image sampling. It should be understood that the application is not limited to the double-layer or multi-layer multi-spectrum photosensitive device, but also applicable to a single-layer photosensitive device.

Technical Solution

In order to describe the application and explain the difference with the prior arts for convenience, "a double-layer photosensitive device", "a double-sided photosensitive device" and "a double-direction photosensitive device" will be defined as follows. The double-layer photosensitive device means that a photosensitive pixel thereof is divided into two layers physically (as the two-layer photosensitive device described in the application titled "Multi-spectrum Photosensitive Devices and Methods for Manufacturing the Same" (PCT/CN2007/071262) of the present inventor previously), and each layer includes photosensitive pixels sensing specific spectrums. The double-sided photosensitive device refers to a photosensitive device having two photosensitive surfaces, each can sense light in at least one direction. The double-direction photosensitive device means that a photosensitive device can sense light from two directions (which typically form an angle of 180 degrees), i.e., sense light from both front and back side of the photosensitive device.

A photosensitive device may have at least one of the following characteristics: double-layer, double-sided, and double-direction.

The technical solutions according to the present application are as follows.

A multi-spectrum photosensitive device, comprising: a pixel array arranged in row and column;

a first combining unit for combining-and-sampling two neighboring pixels in the pixel array which are in a same row but different columns, or in different rows but a same column, or in different rows and different columns to obtain sampling data of a first combined pixel; and a second combining unit for combining-and-sampling the sample data of the first combined pixel obtained in the first combining unit to obtain sampling data of a second combined pixel.

The multi-spectrum photosensitive device further comprises a third combining unit for combining-and-sampling the sampling data of the second combined pixel obtained in the second combining unit to obtain sampling data of a third combined pixel.

According to the multi-spectrum photosensitive device, the first or second combining unit is formed by a charge superposition between pixels with same or different colors or a signal averaging of pixels with different colors, wherein pixels with different colors (including the charge superposition method and the signal averaging method) are combined according to a color space conversion to meet requirements of color reconstruction.

According to the multi-spectrum photosensitive device, the charge superposition of pixels is accomplished in a reading capacitor (FD).

According to the multi-spectrum photosensitive device, combining-and-sampling based on color performed in the first or the second combining unit includes same-color combining, different-color combining, hybrid combining, or selectively abandoning redundant colors, and the combining-and-sampling performed in the first and second combining units is not simultaneously performed by the same-color combining, that is, at least one of the first and the second combining process is not performed by the same-color combining.

According to the multi-spectrum photosensitive device, combining-and-sampling based on position performed in the first or the second combining units includes at least one of following three methods: automatic averaging of signals output directly to a bus at the same time, row skipping or column skipping, and one-by-one sampling. That is to say, these kinds of combining-and-sampling based on position may be used alone or in combination.

According to the multi-spectrum photosensitive device, combining-and-sampling in the third combining unit is performed by at least one of color space conversion and backend digital image scaling.

According to the multi-spectrum photosensitive device, the color space conversion includes a conversion from RGB to CyYeMgX space, a conversion from RGB to YUV space, or a conversion from CyYeMgX to YUV space, wherein X is any one of R (red), G (green) and B (blue).

According to the multi-spectrum photosensitive device, the pixel array is consisted of a plurality of macro-pixels each including at least one basic pixel, wherein the basic pixel may be a passive pixel or an active pixel.

According to the multi-spectrum photosensitive device, the basic pixel of the macro-pixel is arranged in a square pattern or a honeycomb pattern.

According to the multi-spectrum photosensitive device, the macro-pixel may be consisted of at least of a 3T active pixel without the reading capacitor (FD) and a 4T active pixel having one reading capacitor (FD).

According to the multi-spectrum photosensitive device, the 4T active pixel with one reading capacitor (FD) in each macro-pixel employs a reading circuit, wherein the reading circuit is shared by 4, 6, or 8 points.

According to the multi-spectrum photosensitive device, the macro-pixel may be consisted of four pixels arranged in the square pattern and two opaque reading capacitors (FD) located between two rows, wherein one reading capacitor (FD) is shared by pixels in a preceding row and pixels in a next row, charges may be transferred between the two reading capacitors (FD), and at least one of the reading capacitors is connected to a reading circuit.

The macro-pixel may be consisted of at least one basic pixel having a 3T or 4T active pixel with a reading capacitor (FD) shared by two points, or three points, or four points, wherein the basic pixel employs a reading circuit which adopts a 4-points bridge sharing mode, or a 6-points bridge sharing mode, or a 8-points bridge sharing mode.

According to the multi-spectrum photosensitive device, each macro-pixel may be consisted of at least one basic pixel having a 4T active pixel with the reading capacitor (FD) shared by two points, or three points, or four points, wherein the basic pixel employs a reading circuit which adopts a 4-points bridge sharing mode, or a 6-points bridge sharing mode, or a 8-points bridge sharing mode.

According to the multi-spectrum photosensitive device, full-image sampling adopted in the photosensitive device is performed by progressive scanning and progressive reading or progressive scanning but interlaced reading.

According to a further aspect of the present application, a sampling method for a multi-spectrum photosensitive device is disclosed, which includes:

a first combining process for combining-and-sampling two neighboring pixels in the pixel array which are in a same row but different columns, or in different rows but a same column, or in different rows and different columns to obtain sampling data of a first combined pixel; and a second combining process for combining-and-sampling the sample data of the first combined pixel obtained in the first combining process to obtain sampling data of a second combined pixel.

The sampling method may further include a third combining process for combining-and-sampling the sampling data of the second combined pixel obtained in the second combining process to obtain sampling data of a third combined pixel.

According to the sampling method, the first or second combining progress is performed by a charge superposition between pixels with same or different colors or a signal averaging of pixels with different colors, wherein pixels with different colors (including the charge superposition method and the signal averaging method) are combined according to a color space conversion to meet requirements of color reconstruction.

According to the sampling method, combining-and-sampling based on color performed in the first or the second combining process includes same-color combining, different-color combining, hybrid combining, or selectively abandoning redundant colors, and at least one of the first and the second combining process is not performed by the same-color combining.

According to the sampling method, combining-and-sampling based on position performed in the first or the second combining process includes at least one of automatic averaging of signals output directly to a bus, row skipping or column skipping, and one-by-one sampling.

According to the sampling method, the third combining process is performed by at least one of color space conversion and backend digital image scaling.

According to the sampling method, the color space conversion includes a conversion from RGB to CyYeMgX space, a conversion from RGB to YUV space, or a conversion from CyYeMgX to YUV space, wherein X is any one of R (red), G (green) and B (blue).

According to the sampling method, full-image sampling is performed by progressive scanning and progressive reading or progressive scanning but interlaced reading.

Technical Effects

The present application has the following advantages:

In the present application, sub-sampling process is divided into at least two processes, i.e., the aforementioned first combining-and-sampling process and the second combining-and-sampling process. The first and second combining-and-sampling processes are usually conducted between row (combining) sampling and column (combining) sampling of pixels, and mainly conducted to analog signals, in which the order and operations are generally changeable except the charge superposition which is usually only performed in the first combining-and-sampling process. In addition, a third combining-and-sampling process, which is conducted mainly to digital signals after analog-to-digital conversion, may be further included.

In the first combining-and-sampling process, two immediately neighboring pixels in the pixel array are combined. On one hand, combination of immediately neighboring pixels is accomplished. Herein, the pixel obtained after the combination is referred to as a first combined pixel. It should be understood that the concept of the first combined pixel is used to indicate the pixel obtained after the first combining process for the convenience of description. It does not intend to indicate that a "first combined pixel" physically exists in pixel array. The data obtained by the combining and sub-sampling for two neighboring pixels is referred to as sampling data of the first combined pixel. The term of "immediately neighboring" used herein means that the two pixels are abutting when viewed from horizontal, vertical, or diagonal direction with no other pixels interposed therebetween. The cases of immediately neighboring include two pixels being in a same row but different columns, or in different rows but a same column, or in different rows and different columns. Generally speaking, in this combining, a signal is obtained by average of at least two signals so that a noise will be reduced by $\sqrt{N}$ times. Therefore, SNR will be increased by at least $\sqrt{N}$ times after the combining, and the combination may be performed between pixels with same or different colors. On the other hand, pixels to be combined may have different colors, i.e., addition or average of colors is performed. As known from the three primary colors theory, a color formed by adding two primary colors is complementary with the other primary color. Only a color space conversion is required to transfer from a primary color space to a complementary color space. Thus, color reconstruction may also be accomplished by different complementary colors. In other words, the combination of pixels with different colors may be accomplished to improve SNR and the color reconstruction may also be implemented according to the present application. The whole sub-sampling process is optimized so as to meet the high-speed requirement of pixel array with large amount of data. A basic demand for color space conversion is that the combination of colors after conversion is capable of reconstructing the required RGB (or YUV, or CYMK) colors (by interpolation technique etc.).

It should be noted that a plurality of pixels are usually contained in the pixel array, and only two pixels are combined in the first combining-and-sampling. Obviously, a plurality of first combined pixel will be obtained by the combining. For different first combined pixels, the same or different combining methods can be used. The first combining process is referred to as a same-color combining mode when it is performed completely between pixels having a same color. The first combining process is referred to as a different-color combining mode when it is performed completely between pixels having different colors. The first combining process is referred to as a hybrid combining mode when it is performed partly in pixels having a same color and partly in pixels having different colors. The first combining process is referred to as selective redundant color abandoning mode when some redundant color pixels in a pixel array is abandoned (certainly, such abandon is selective and will not affect color reconstruction for example).

Obviously, the second combining process is an operation to the plurality of first combined pixels. Similarly, it is possible to combine the first combined pixels with same or different colors (of course, it may be caused that all the three primary colors are added so that the color reconstruction cannot be accomplished).

The above-mentioned modes of combining, i.e., the same color combining, the different color combining and the hybrid combining are classified based on color. In addition, from the perspective of position selection of the combining and sampling, the combining and sampling modes of the first and second combining process include: automatic averaging of signals output directly to a same bus, row skipping or column skipping, one by one sampling, and combination of two or three of these modes. Except the charge superposition which is only performed in the first combining-and-sampling process, the first and second combining process are the same and changeable (except for their different order).

The mode of so-called automatic averaging of signals output directly to a bus is that signals (same color or different colors) to be combined are simultaneously output to a data collection bus by automatic balance of (voltage) signals to achieve an average value of the signals to be combined. The mode of row skipping or column skipping is that some rows or columns are skipping so that the (combining and) sampling is performed by a reduced volume of data. The mode of one by one sampling is that original pixels or the first combined pixel are read out in turn without any combination. More than one of the three modes may be employed simultaneously. For example, the mode of row skipping or column skipping can be used at the same time with the mode of automatic averaging of signals output directly to a bus or the mode of one by one sampling.

The sub-sampling mode of third combining-and-sampling process includes color space conversion, backend digital image scaling and a serial use of the two modes. The first and second combining processes are mainly applied to analogue signals, while the third combining process is mainly applied to digital signals, i.e., applied after analog-to-digital conversion. Through treating three or four color pixels at different spatial locations as values for a same point and transforming the values to another color space, data in horizontal and (or) vertical direction will be decreased to achieve the effect of sub-sampling. Moreover, the digital image scaling mode is the most intuitive sub-sampling mode which is commonly used.

Charge superposition is implemented at first in the combining-and-sampling of the present application. Almost all sub-sampling in the prior art is performed by averaging voltage or current signals, in which SNR may be increased by up to $\sqrt{N}$ times when N points are combined. The reason is that N pixels having same color are shared by an output line in the existing combining-and-sampling, and thus voltage or current signals of each pixel in this output line have to be (automatically) averaged. Therefore, improvement of the SNR is only in that noise will be decreased by $\sqrt{N}$ times after combination, and thus the SNR will increase at most $\sqrt{N}$ times. However, the SNR can be increased by N times by employing the charge superposition method of the present application, for example, through storing all related charges in the read out capacitor so as to achieve superposition of charges, so that the SNR will be improved by at least N times, which is $\sqrt{N}$ times higher than the method for averaging signals. That is to say, combing N signals by the charge superposition method may theoretically achieve the effect of averaging $N^2$ or more signals (as described below), which is a method significantly improving the SNR.

Another significant effect brought forth from superposition of adjacent (immediately neighboring) pixels is that crosstalking between pixels will be decreased. This is because that colors which are interfered by each other originally may all legitimately belong to the combined signal now. That is to say, the part of signals belonged to noise originally become the effective part of signals now. Thus, improvement of the SNR caused by superposition of N signals may be close to the limit theoretically, i.e., $N\sqrt{N}$ times, and thus achieving the effect of averaging $N^3$ signals.

Charge superposition is a combining-and-sampling mode with significant effect, in which pixels to be combined are required to be adjacent spatially. The reason why such effect cannot be achieved by previous sub-sampling is that the previous sub-sampling is only performed between pixels with a same color and the pixels to be combined are separated non-adjacently by other pixels. It is relatively easy to implement charge superposition for a multilayer photosensitive device because its color patterns are very rich. However, it is also easy to achieve charge superposition in a single-layer photosensitive device as long as the color space converting method of the present application is performed.

During full-image sampling (i.e., sampling one image in the highest resolution) in the present application, a progressive scanning interlaced reading mode is used, and thus the full image reading frame rate of a large-array image will be doubled during shooting single photo without increasing the clock rate and using the frame buffer. If an AD converter and a column buffer are added, the full image reading frame rate will be improved greatly. The method is important for elimination of mechanical shutters.

Note that the progressive scanning interlaced reading mode in the present application is different from an interleaved scanning method in a conventional television system. The conventional interleaved scanning method is interlaced scanning interlaced reading. Therefore, the time (no matter sensing time or reading time) between odd and even fields is one field difference, i.e., half frame difference. However, the sensing time sequence of pixels in the progressive scanning, interlaced reading mode of the present application is the same as that in the progressive scanning progressive reading method, except that the reading sequence of row is changed.

A new photosensitive device and sub-sampling method thereof with more power and wider applicability according to embodiments of the present application will be discussed by exemplary embodiments. The preferred implementation methods are only examples for demonstrating implementations and advantages thereof according to the present application, but in no way to limit the scope of the application.

For those skilled in the art, the above and the other purposes as well as advantages of the present application will become apparent with the following descriptions and a plurality of illustrations of preferred embodiments with reference to the accompanying drawings as shown below.

DRAWINGS

Figure 4:
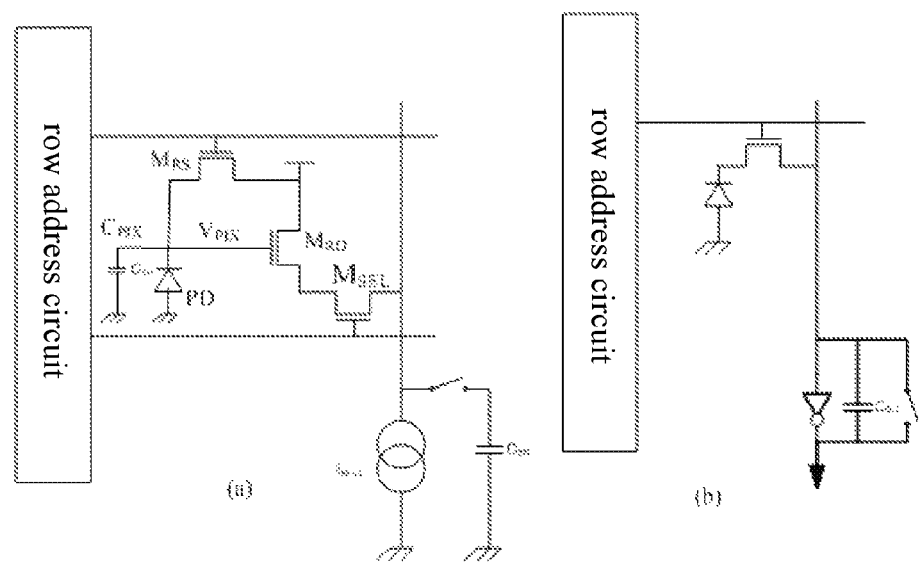

FIGS. 4(*a*) and 4(*b*) illustrate the relationship between a reading (sampling) circuit and a column address selection circuit for CMOS active and passive pixels, respectively.

Figure 5:
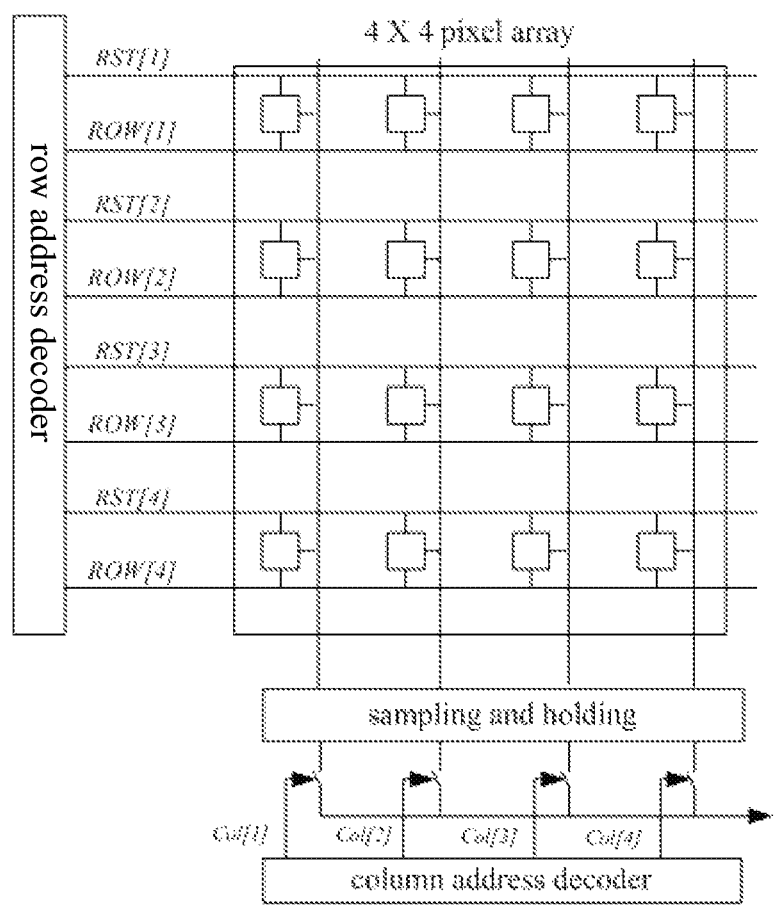

FIG. 5 is a structural schematic diagram of a reading (sampling) circuit connected with a row selection circuit and a column selection circuit for a CMOS pixel.

Figure 6:
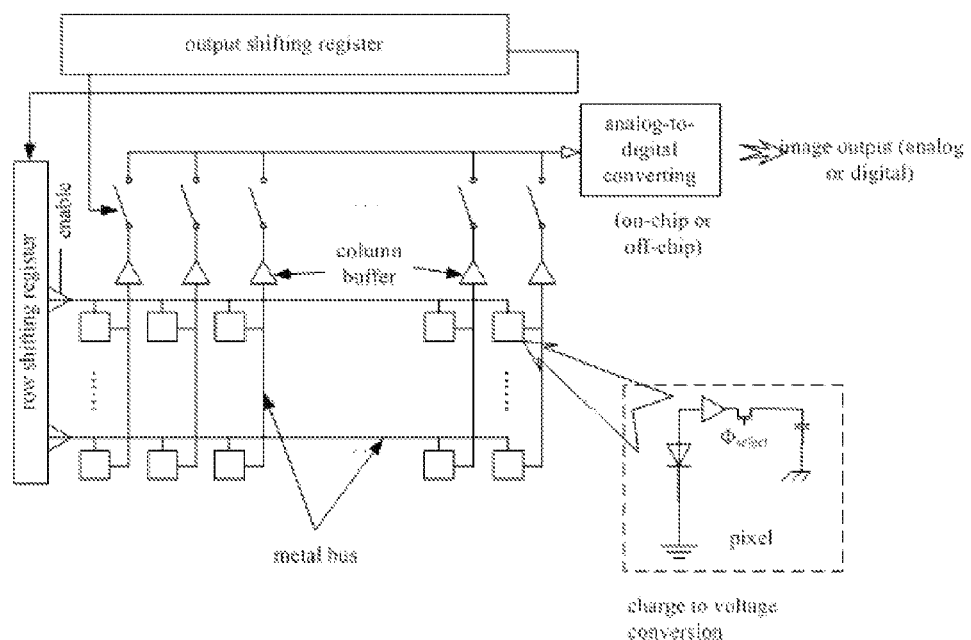

FIG. 6 illustrates a typical schematic diagram of a reading (sampling) circuit having column buffers for a practical CMOS pixel.

Figure 7:
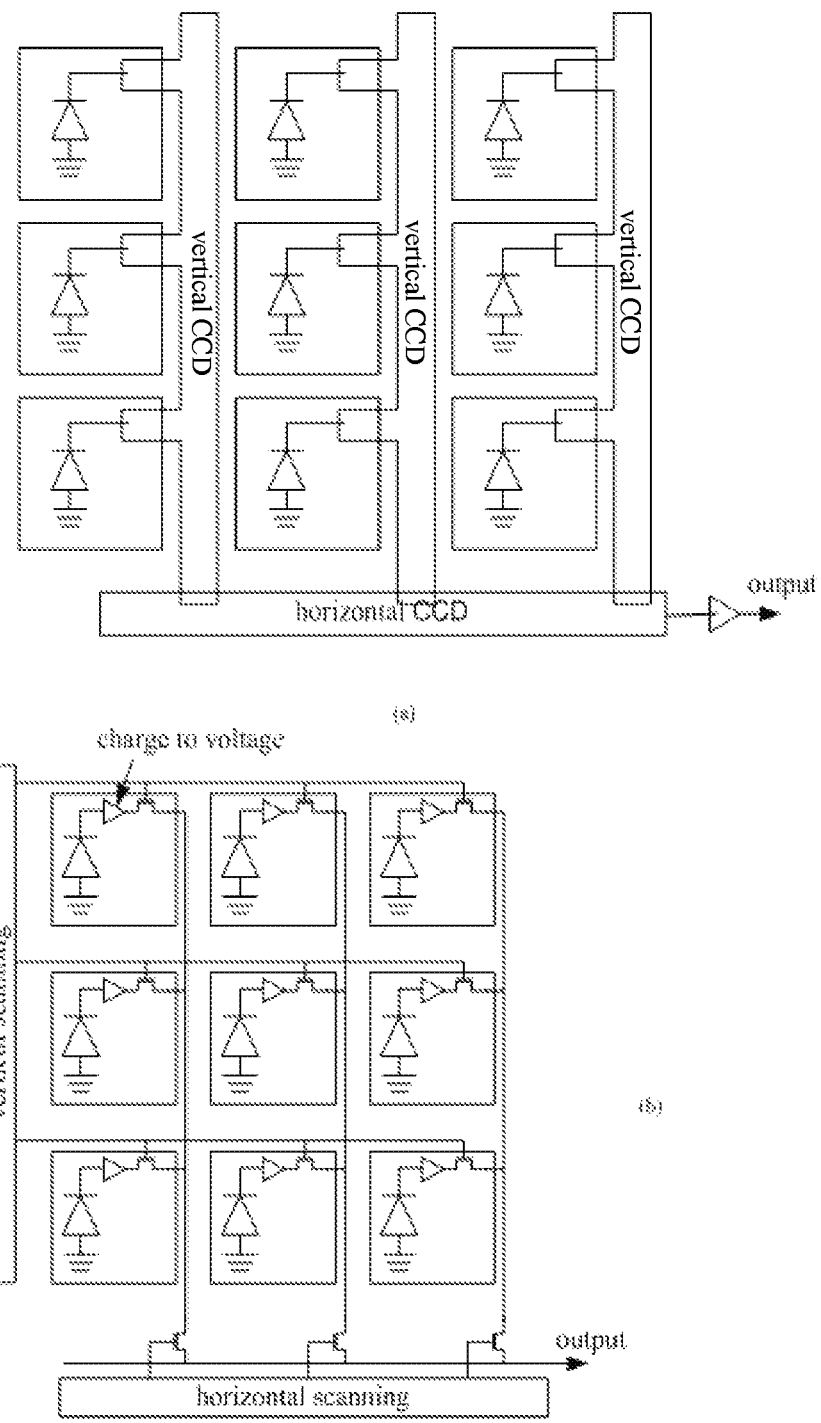

FIG. 7 illustrates a comparison between a reading method of a CCD pixel (see FIG. 7(a)) and a reading method of a CMOS pixel (see FIG. 7(b)), in which the CCD pixels in a vertical direction are scanned one by one, as shown in FIG. 7(a).

Figure 8:
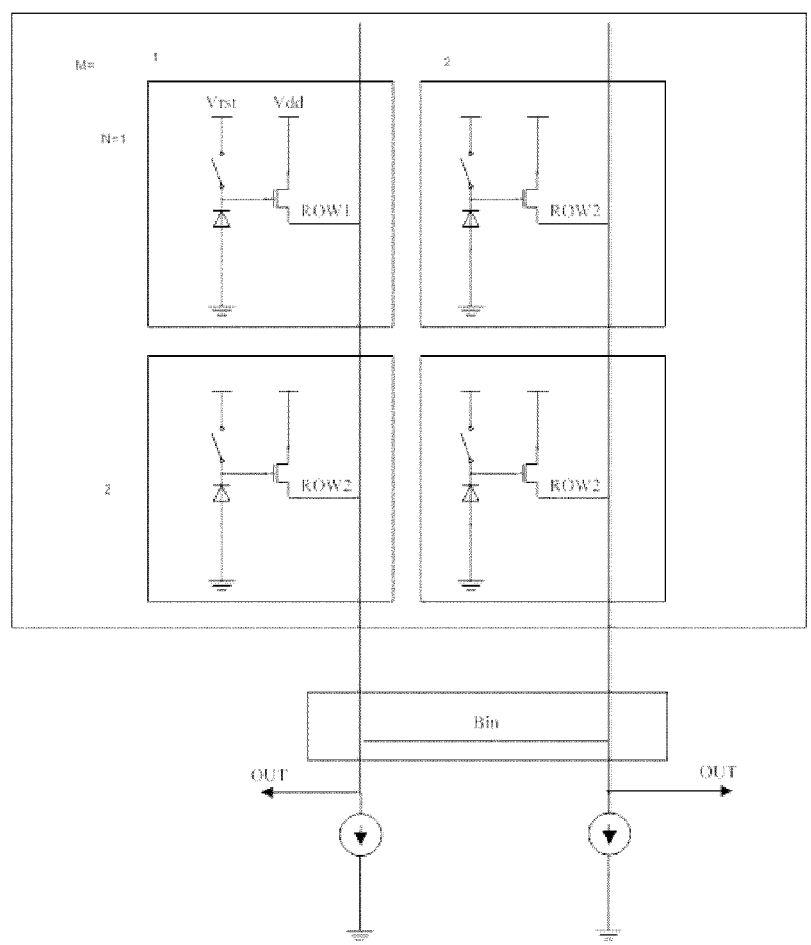

FIG. 8 illustrates the basic principles in U.S. Pat. No. 7,091,466B2, where average values of combined pixels are obtained by opening simultaneously switches of same pixels to be combined, outputting related signals to a sampling bus simultaneously to obtain balance.

Figure 9:
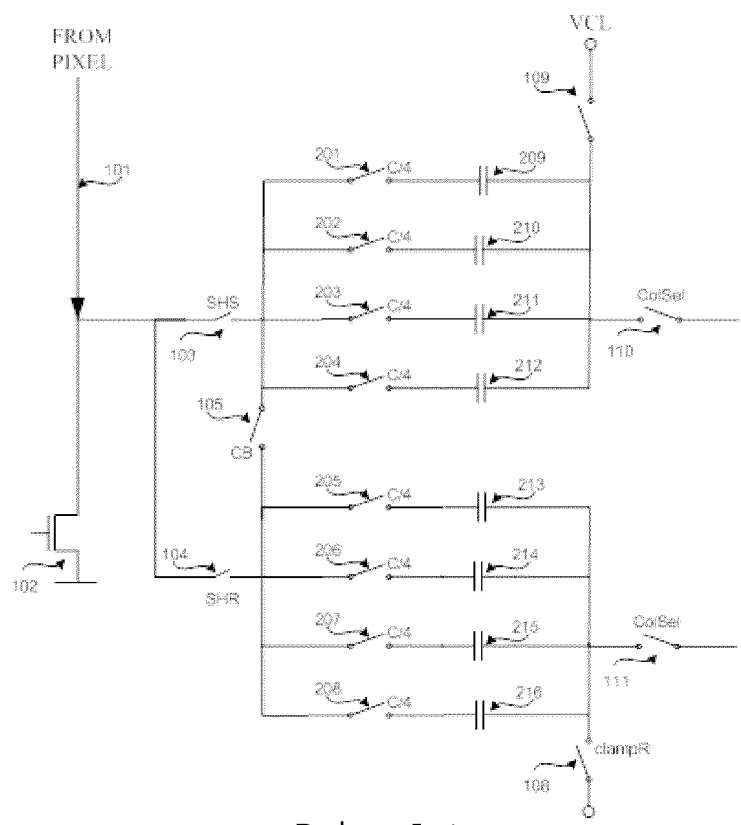

FIG. 9 illustrates the basic principles in U.S. Pat. No. 7,319,218B2, where average values of combining pixels are obtained by opening simultaneously the switch of same pixels to be combined, outputting related signals to the sampling bus simultaneously to obtain balance. The basic principle of this patent is similar to that of U.S. Pat. No. 7,091,466B2, only except the different circuits adopted.

Figure 10:
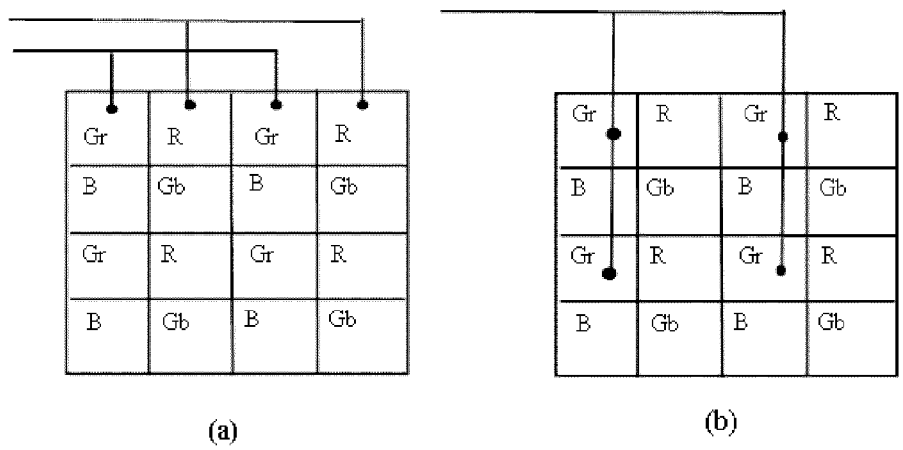

FIG. 10 shows basic ideas of an existing same-color combination technology of pixels, i.e., pixels of adjacent macro-pixels sensing same color (in the method of signal averaging) are combined. FIG. 10(a) is a schematic diagram of combining rows, while FIG. 10(b) is a schematic diagram of combining rows and columns simultaneously.

Figure 11:
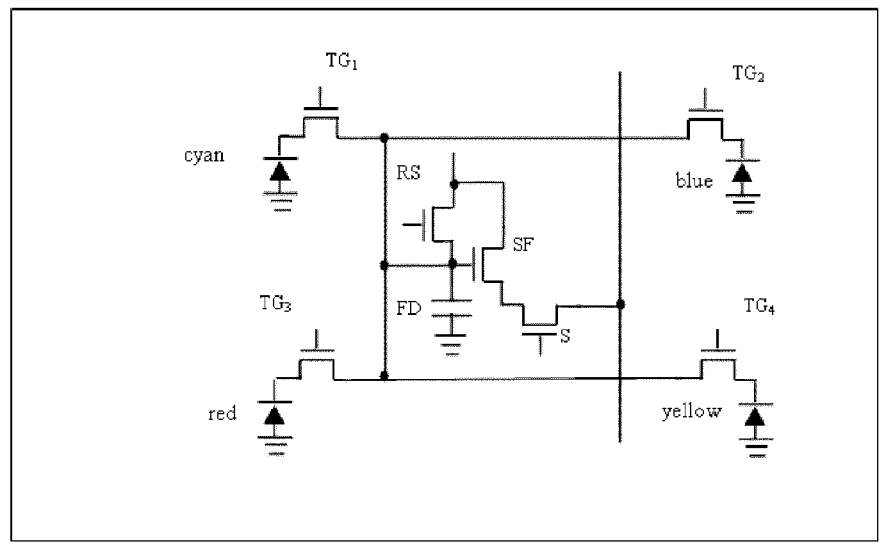

FIG. 11 illustrates a currently used reading circuit for a 4T active photosensitive pixel shared by 4-points, wherein 1.75 gates are used for each pixel in average.

Figure 12:
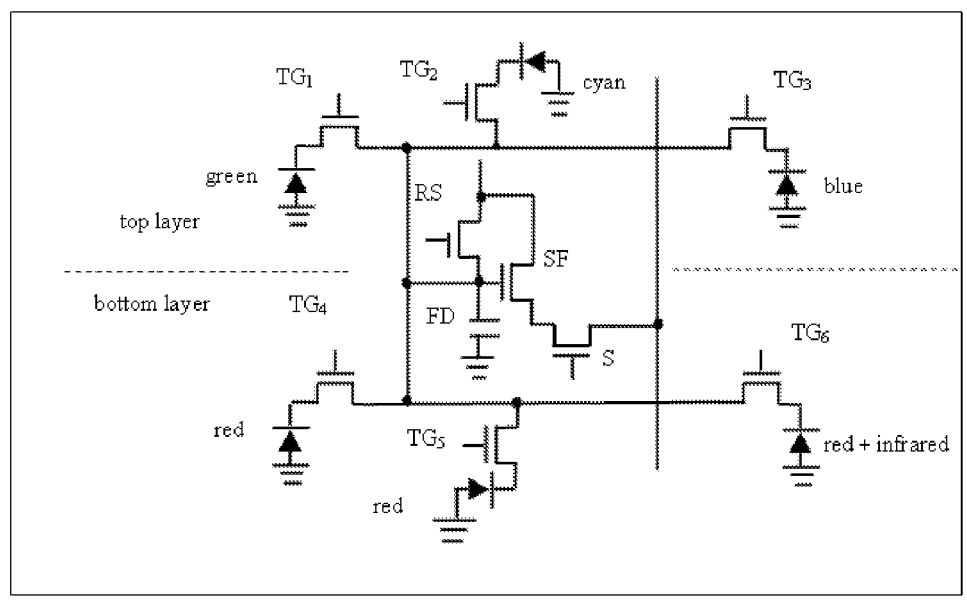

FIG. 12 illustrates a reading circuit for a 4T active photosensitive pixel shared by 6-points, wherein only 1.5 gates are used for each pixel in average. This reading circuit is suitable for a double-sided double-layer photosensitive device in which pixels are arranged in a honeycomb pattern (referring to Chinese Patent Application No. 200810217270.2 titled "Multi-spectrum Photosensitive Devices and Methods for Manufacturing the Same"), i.e., photosensitive diodes in both upper and lower layers of all three composite pixels in a macro-pixel may share a same reading capacitor (FD) and a same 3T reading circuit.

Figure 13:
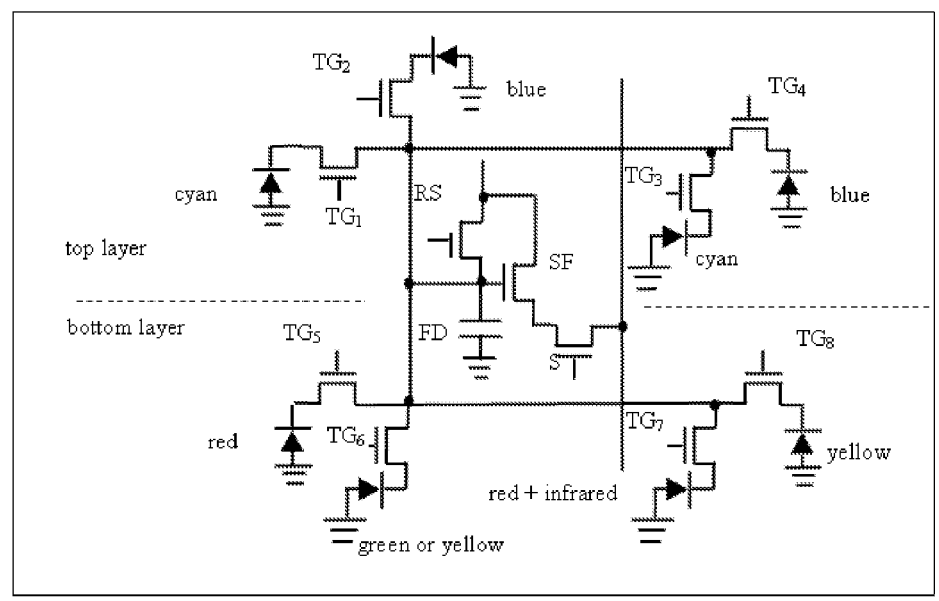

FIG. 13 illustrates a reading circuit for a 4T active photosensitive pixel shared by 8 points, wherein only 1.375 gates are used for each pixel in average. This reading circuit is suitable for a double-sided double-layer photosensitive device in which four-pixel macro-pixels are arranged in a square pattern, i.e., photosensitive diodes in both upper and lower layers of all four composite pixels in a macro-pixel may share a same reading capacitor (FD) and a same 3T reading circuit.

Figure 14:
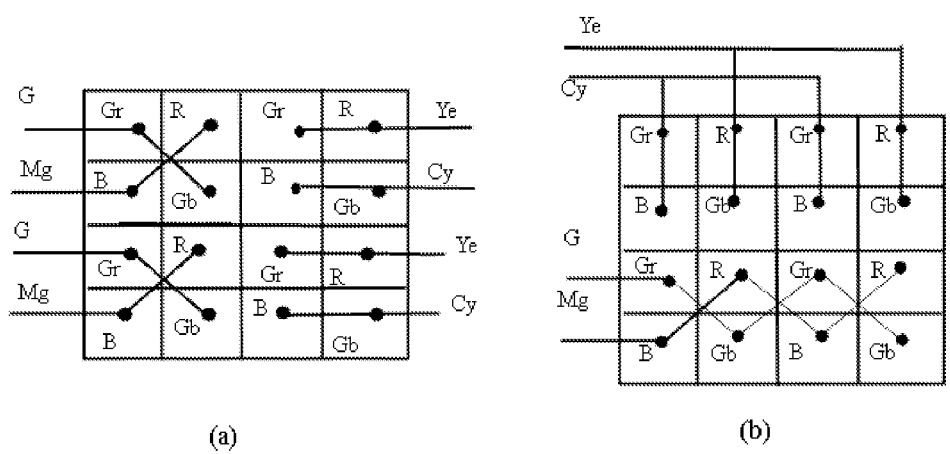

FIG. 14 shows basic ideas of the different color combining and the hybrid combination technologies according to the present application that two pixels having different or same color within one macro-pixel (in method for averaging or summing signals) are combined at first, and then two adjacent pixels having same color are combined. FIG. 14(a) is a schematic diagram showing combination of two columns of a Bayer pattern photosensitive device, while FIG. 14(b) is a schematic diagram showing simultaneous combination of two columns and two rows of a Bayer pattern photosensitive device. Herein, the different-color combination is formed when combining G and B, or combining G and R; while the hybrid combination is formed when mixing the combinations of G and B, of G and R, of B and R, as well as of G and G, because some of which is conducted between same colors (G and G), while others are between different colors. After the hybrid combination, the primary color (RGB) image of Bayer pattern is transformed into a complementary color (CyYeMgG) image. In this Figure, the combinations of G and B, G and R, B and R, as well as G and G constitute the first combining process. The second combining process is implemented by outputting simultaneously the values of Cy, Ye, Mg, and G at different positions to the bus followed by combination with the same color combination method, or skipping some pixels by using line or column skipping method, and reading out one by one.

Figure 15:
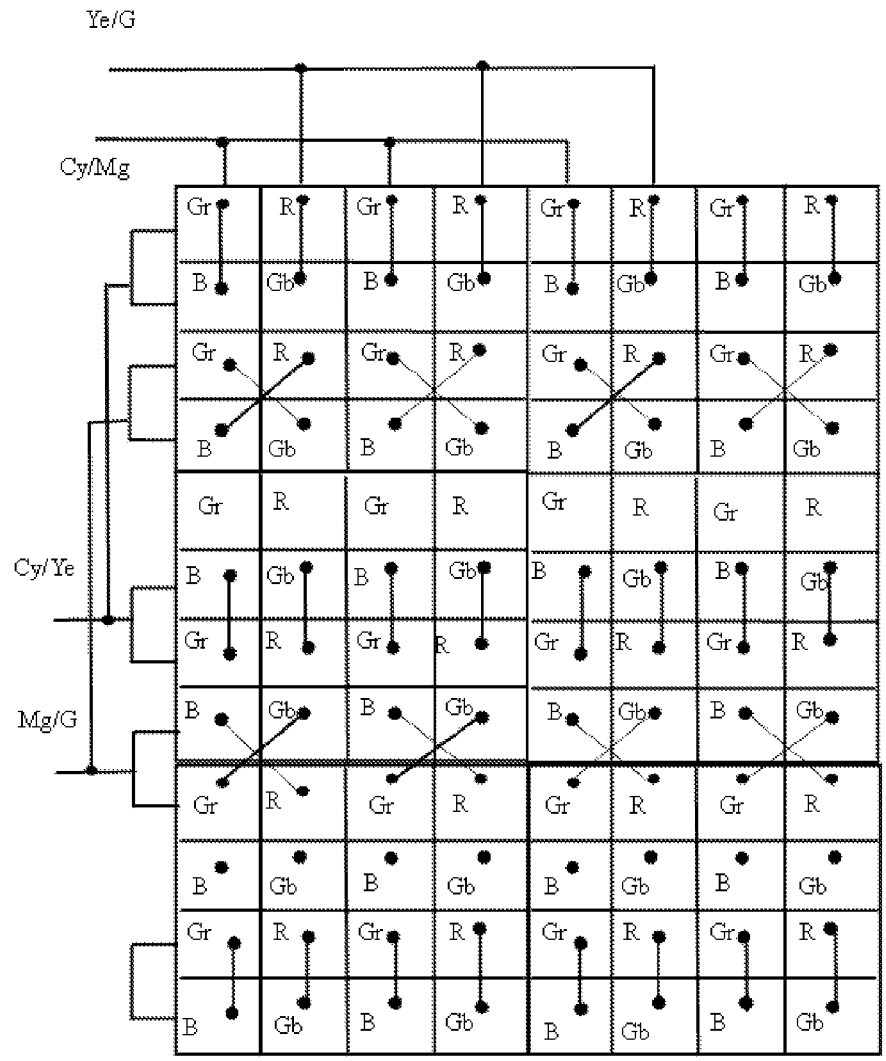

FIG. 15 illustrates the hybrid combining technology according to the present application used in a more general combination of M rows and N columns (5×3 shown in the Figure, i.e., a combination of five rows and three columns). A variety of different cases similar to FIG. 15 may be obtained by combining methods of skipping or crossing rows and columns. The combination of three rows and three columns can be accomplished by combining two rows and two columns while skipping one row and one column.

Note that a pair of signals (Mg and G) located in the same midpoint position will be generated when a cross combination is conducted in the third and fourth rows. In order to facilitate the combination of latter columns, either Mg or G may be considered in the front position so as to keeping uniformity.

With the symmetry property of rows and columns, FIG. 15 is expanded easily to various combinations of 3×5, 2×3, 3×2, 2×4, 4×2, 5×2, 2×5, 2×6, 6×2, 3×4, 4×3, 3×6, 6×3, 4×4, 4×5, 5×4, 4×6, 6×4, 5×6, 6×5, 6×6, 7×6, 6×7, 7×7, 8×8, and etc. The combining factors of 2×2, 2×4, 4×2, 4×4, 3×6, 6×3, 6×6, 4×8, 8×4, and 8×8 are more useful, by which the length-width aspect ratio of the image are easily to be kept. Similarly, in this Figure, the combinations of G and B, G and R, B and R, as well as G and G constitute the first combining process. The second combining process is implemented by outputting simultaneously the values of Cy, Ye, Mg, and G at different positions to the bus which are followed by a combining process according to the same color combination method, and skipping some unavailable pixels therebetween (such as, the fifth row and the tenth column in the Figure). The skipping colors will no longer join the following third combining-and-sampling process, if the sensing device has the function of the third combining-and-sampling process.

Figure 16:
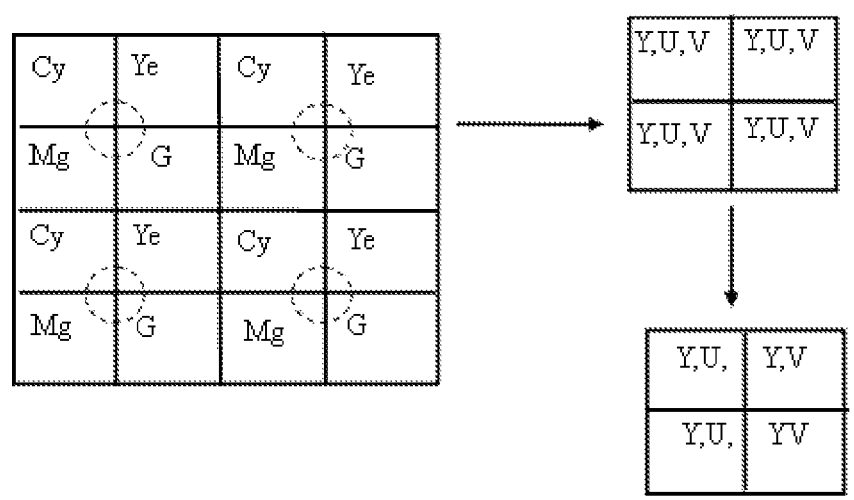

FIG. 16 illustrates an additional 2×2 image down-scaling caused by the conversion of color space matrix. No matter a CyYeMgG image is an original image or an image obtained from Bayer RGM image through the hybrid combination method of the present application, an additional 2×2 image down-scaling may be obtained when the CyYeMgG image is converted to a YUV image. The down-scaling method is that a macro-pixel of CyYeMgG is regarded as four pixels at a common point so as to be converted to a pixel of (Y,U,V), and then a YUV422 image (typically required for preview and JPEG/MPEG compression) is implemented through averaging values of adjacent (horizontal direction) U and V pixels.

Figure 1:
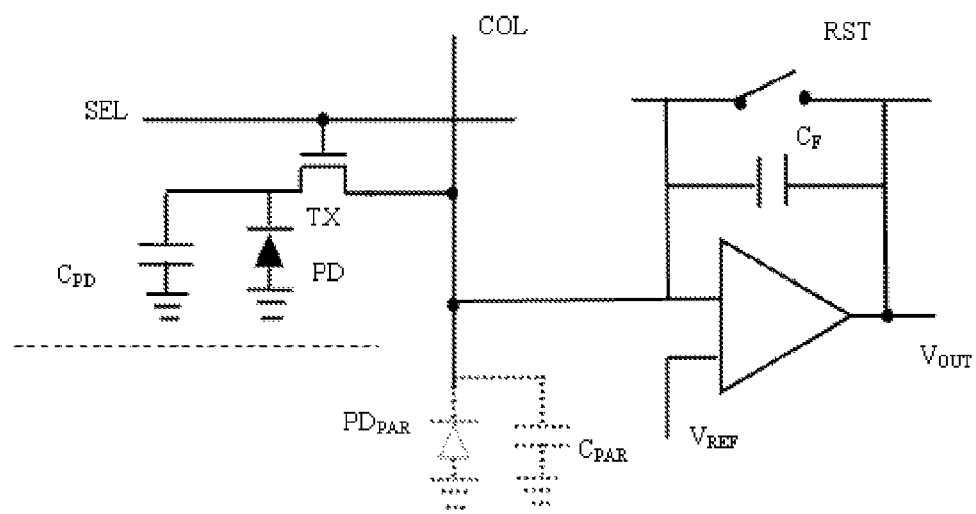
FIG. 1 illustrates a reading (sampling) circuit for a CMOS passive pixel.
Figure 2:
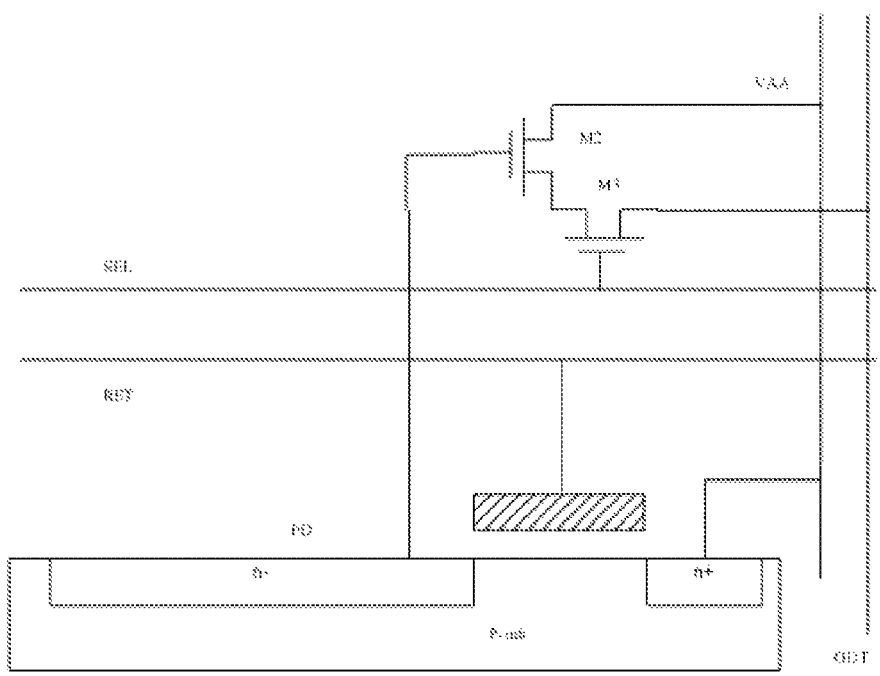
FIG. 2 illustrates a reading (sampling) circuit for a CMOS 3T active pixel.
Figure 3:
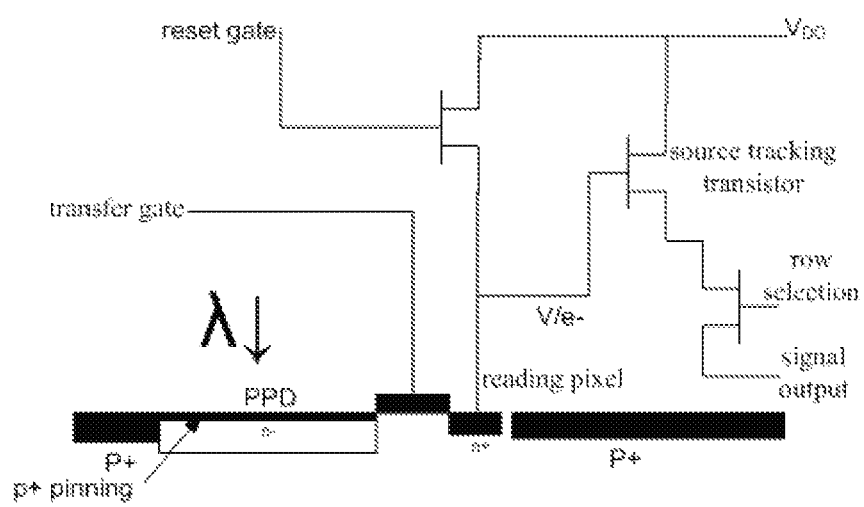
FIG. 3 illustrates a reading (sampling) circuit for a CMOS 4T active pixel.
Figure 17:
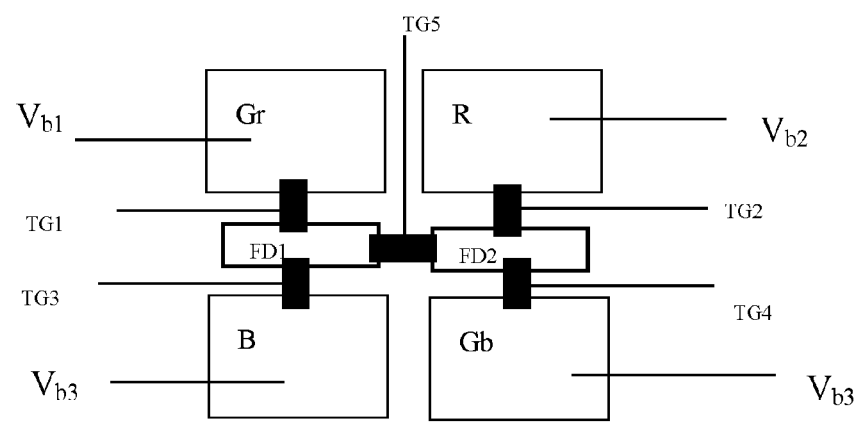
Figure 21:
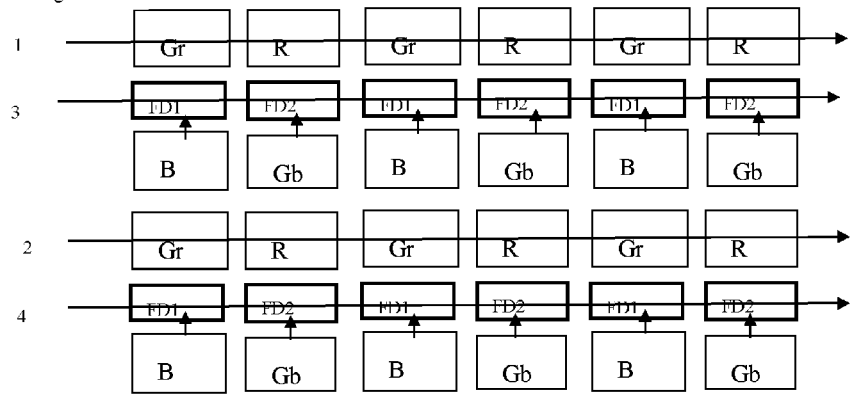
Figure 21:
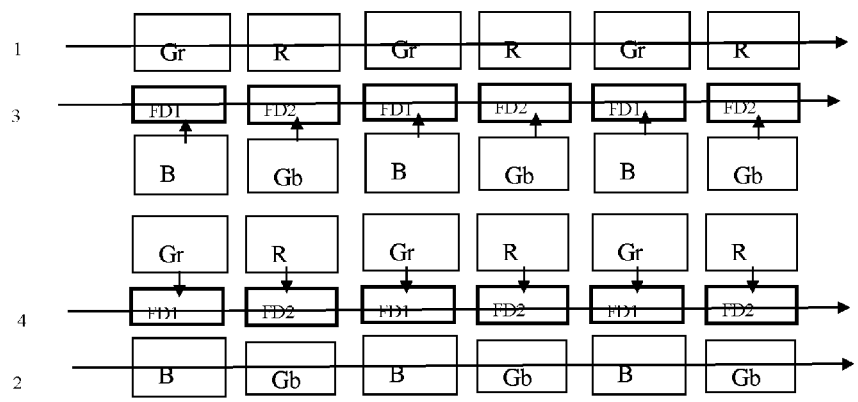

FIG. 17 illustrates an excellent reading circuit of the application, wherein an opaque reading capacitor FD (e.g. FD1 and FD2 shown in FIG. 1) is shared by photosensitive pixels in odd and even rows. A switch TG1 is used for selectively moving charges of a photosensitive diode Gr into FD1. Similarly, switches TG2, TG3, and TG4 are also used for moving charge values of R, B, and Gb into FD2, FD1 or FD2 respectively. Another switch TG5 is used for reading capacitance values of the reading capacitor FD1 into FD2 (or from FD2 into FD1) in summing method. The photosensitive pixels having this arrangement may employ a four-point bridge sharing reading circuit shown in FIG. 18. In this circuit, the opaque property required by the reading capacitor FD is necessary for implementing progressive scanning interlaced reading or skipping reading as shown in FIG. 21.

Figure 18:
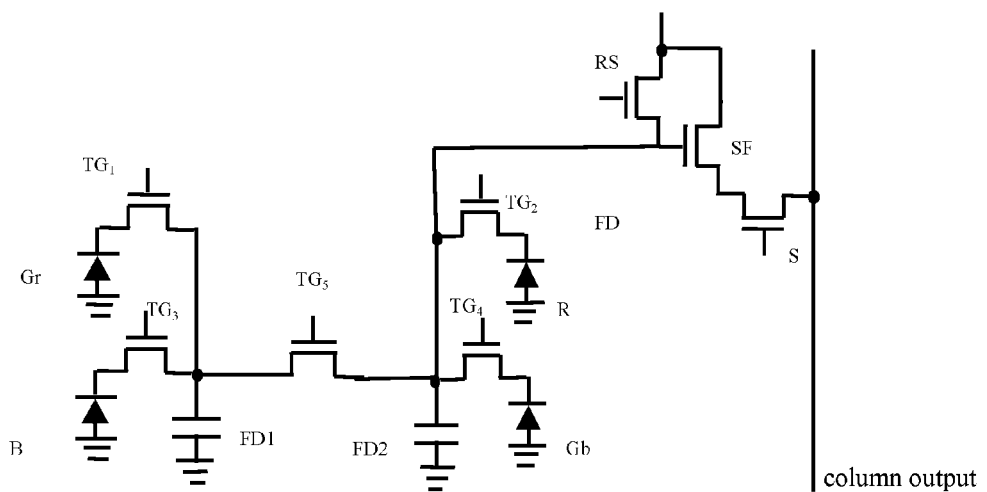

FIG. 18 illustrates a four-point bridge sharing reading circuit used for a four-point macro-pixel matrix pattern of the present application, wherein each pixel uses two transistors. Although the circuit is not a sharing reading circuit of minimum gates, it has many advantages in some other fields. One advantage is that during sub-sampling, pixel value of Gr in odd line and that of B in even line may be superposed in the summing method by opening TG1/TG3 or TG2/TG4 simultaneously, such that signals are increased while noise may be decreased. Similarly, pixels in a diagonal line may be read out with summing methods by controlling time sequence to open TG1/TG4/TG5 or TG2/TG3/TG5 simultaneously. Another advantage is that interlaced reading or skipping reading as shown in FIG. 21 may be implemented by storing pixel values in the next row into FD during full image sampling.

Figure 19:
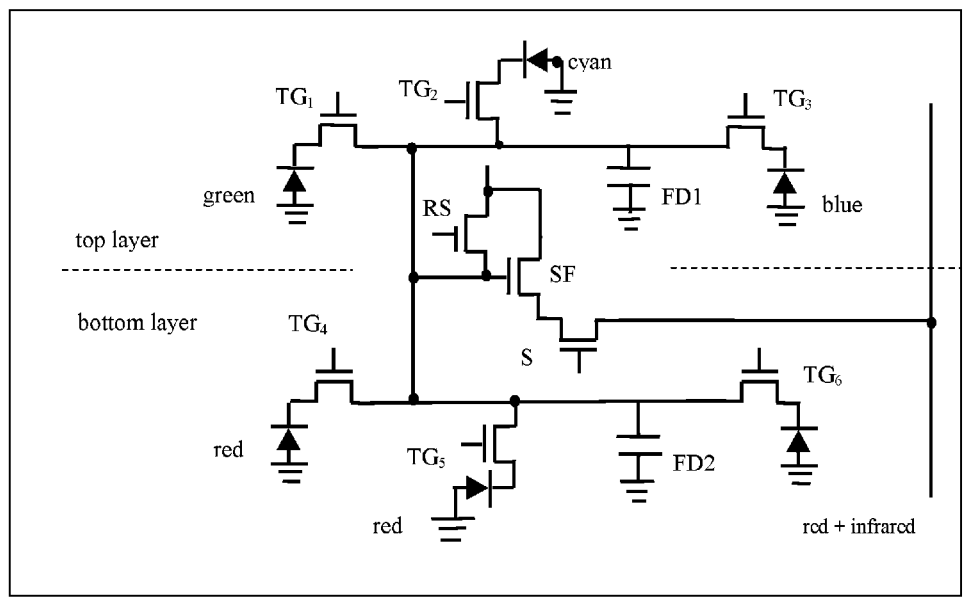

FIG. 19 illustrates a six-point sharing reading circuit used in a double-layer photosensitive device having three-pixel macro-pixel honeycomb pattern according to the present application. In this circuit, a reading capacitor FD1 is shared by three pixels in a top layer, while a reading capacitor FD2 is shared by three pixels in a lower layer, and an amplifying and reading circuit is shared by both the three pixels in the top layer and that of the lower layer. The method of sharing a reading circuit by a top and lower layer may simplify designs and make control logic of sub-sampling simple. This circuit is different from that of FIG. 12 in that herein the reading capacitor is not shared by the top and lower layers so as to make manufacturing double-sided photosensitive devices easy.

Figure 20:
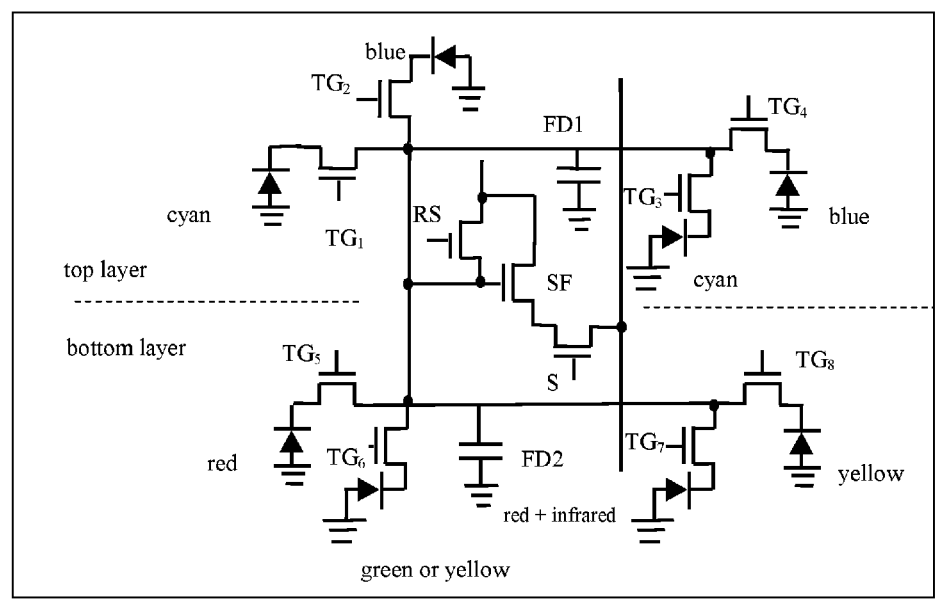

FIG. 20 illustrates an eight-point shared reading circuit used in a double-layer photosensitive device having four-pixel macro-pixel honeycomb pattern according to the present application. In this reading circuit, a reading capacitor FD1 is shared by four pixels in a top layer, while a reading capacitor FD2 is shared by four pixels in a lower layer, and an amplifying and reading circuit is shared by both the four pixels in the top layer and those of the lower layer. This circuit is different from that of FIG. 13 in that herein the reading capacitor is not shared by the top and lower layers so as to make manufacturing double-sided photosensitive devices easy.

Obviously, for a double-sided double-layer photosensitive device, four macro-pixels in top and lower layers may employ the double FD bridge-shared reading circuit shown in FIG. 18 respectively, such that reading circuits for the top and lower layers are relatively independent and may be read in interlaced or skipping methods to increase shutter speeds while taking full resolution image.

FIG. 21 illustrates a schematic diagram of the sampling reading circuit shown in FIG. 17 which is used for in interlaced reading method (FIG. 21(a)) or skipping reading method (FIG. 21(b)) during full image sampling.

When a first row (GrRgGrR . . . ) is read out during interlaced reading in FIG. 21(a), each pixel value in a second row (BGBG . . . ) is transferred into an empty FD after the value of the corresponding position in the first row has been read out. That is, when the pixel at the column N in the first row is being read out, the pixel at the column N−1 (or N−2, etc.) in the second row is being transferred into a vertically corresponding FD area associated with the first and second rows. That is, immediately following the first row, it is the pixel values in third row rather than those in the second row now stored in the FDs shared by the first and second rows that are then read out. In the same way, during read out of pixel values in the third row, pixel values of the fourth row are transferred into FD regions simultaneously. In other words, all of the pixels values in even rows will be shifted to FD buffer regions until the pixel values in odd rows are read out completely. Finally the pixel values of the even rows are read out row by row in turn from the FD buffer regions.

When a first row (GrRgGrR . . . ) is read out during skipping reading in FIG. 21(b), values of a second row (BGBG . . . ) are transferred into emptied FDs after values of corresponding positions in the first row have been read out. That is, when the pixel at the column N in the first row is being read out, the pixel at the column N−1 (or N−2, and etc.) in the second row is being transferred into a vertically corresponding FD area. Following the first row, the pixel value in the fourth row other than that of the third row is then read out, while the pixel value in the third row is transferred into FD region. On the same way, while the pixel values in the third row are read out, the pixel values of the fourth row are transferred into the FD regions simultaneously. In other words, the rows are read out according to an order of 1, 4, 5, 8, . . . , 2, 3, 6, 7. One of advantages of FIG. 21(b) is that first half of the frame is still arranged in the Bayer pattern, and then a thumbnail preview image can be got rapidly at the moment of photographing according to this method.

The method of interlaced or skipping reading in FIG. 21 is different to a field-scanning method used in the previous television system. The main difference is that sensing time of the second half frame stored in the buffer region is almost as same as that of the first half frame. Therefore the shutter speed is doubled comparing to the row-by-row reading, while the situation of one field (half frame) delay between even and odd fields induced by field scanning method in a television system is avoided. The situation is suitable for the case of capturing a single photograph other than a continuous video recording.

It is a very valuable method to improve the speed of electrical shutter during taking photos through interlaced or skipping reading. For example, if the reading clock for pixels is set to 96 MHz and the number of pixels of photosensitive chip is 8 millions, then the shutter speed is (96/8)=12 fps or 1/12 second during taking a full image. If the interlaced or skipping reading method shown in FIG. 19 is used, the single frame of interest is instantaneously improved to 24 fps or 1/24 second, i.e. the speed is doubled. The photographing shutter speed up to 1/24 second means that the mechanical shutter on a photographing module of mobile phones can be omitted, while the mechanical shutter is necessary for photographing with speed of 1/12 second to prevent image twisting induced by hands shake.

Figure 22:
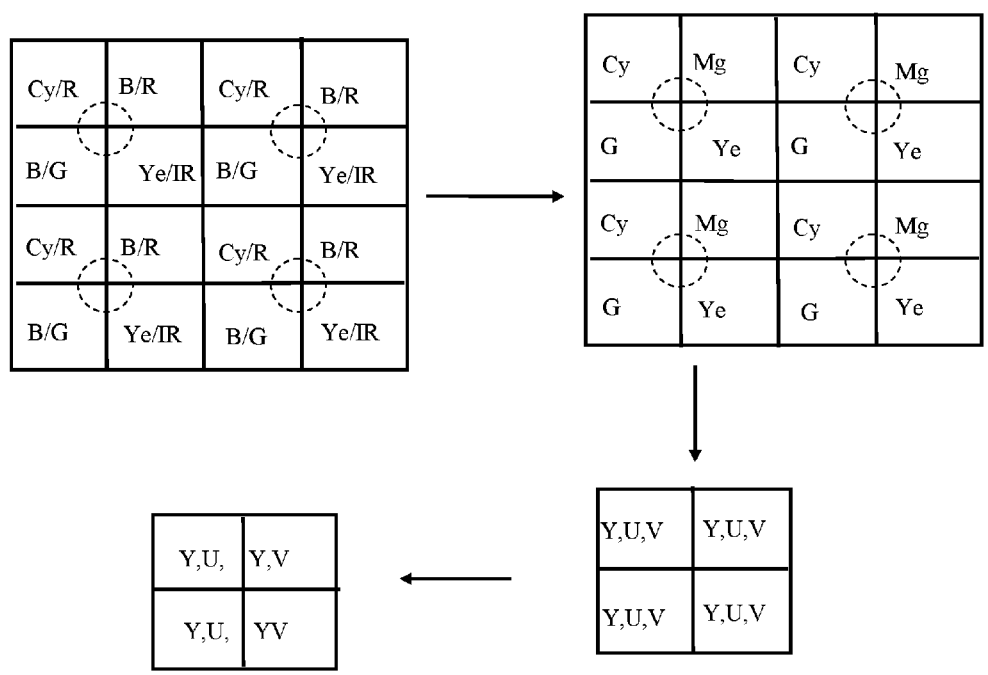

FIG. 22 illustrates a simplified treatment situation for a double-layer photosensitive device during sub-sampling: in the first combining process, a combining or abandoning method is used on redundant color pixels of upper and lower layers, and then only the color components necessary for color reconstruction, for example, Cy, Mg (obtained by combining B and R), G and Ye, are reserved. A YUYV422 image is obtained in the third combining process, during which the color space transforming method shown in FIG. 16 is used to convert adjacent pixels of CyYeMgG into pixels of YUV color, and subsequently two sub-sampling at horizontal direction is done on adjacent UV components. A 2×2 sub-sampling is executed during this process. If the image is still too large, averaging same colors in CyYeMgG instead of full image sampling method shown in the Figure is carried out during the second process before transforming CyYeMgG color space into YUV color space.

During full image sampling, the double-layer photosensitive device can ignore some pixels, or read out all of the pixels which will be handled by a back-end processor. The data volume for reading out all of the pixels is doubled. Now with the interlaced or skipping reading method shown in FIGS. 18 and 22, the frame rate is doubled and is then equal to the speed of existing single-layer photosensitive device.

FIG. 22 is enough to illustrate the complexity and variety of the double-layer or multilayer photosensitive devices during sub-sampling. Since there are more than thousands of possibilities for color distributions of the macro-pixels for the double-layer or multilayer photosensitive device, more kinds of corresponding possibilities exist for sub-sampling. Then only a few of the methods are listed here to illustrate essence of the present application.

Figure 23:
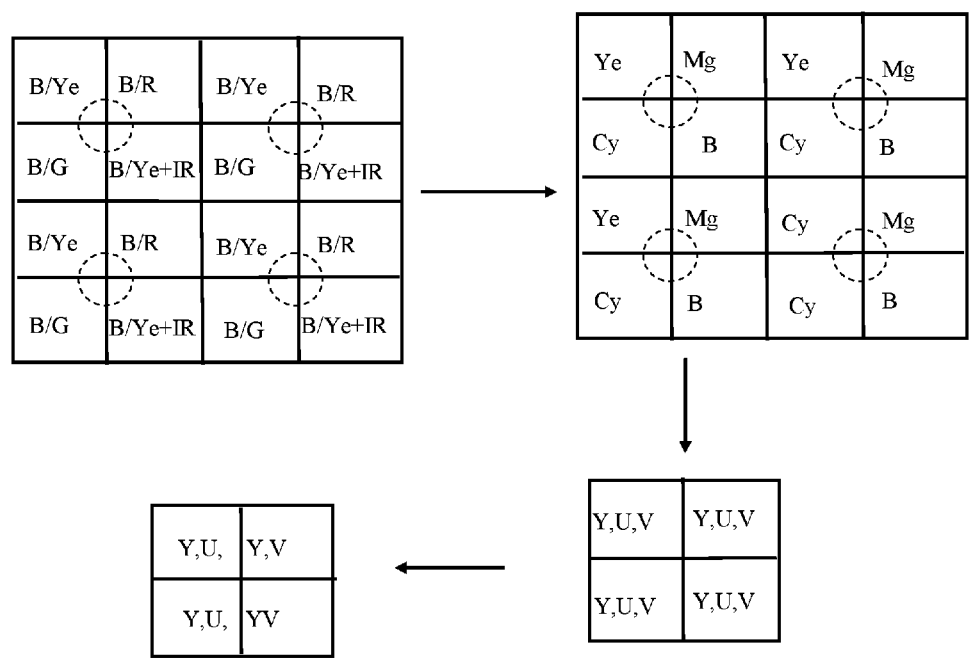

FIG. 23 illustrates another simplified treatment situation for a double-layer photosensitive device during sub-sampling: the macro-pixels of CyYeMgB are obtained through pixels addition (or averaging) in the first combining process. The four points are converted to YUV color through color transforming in the third combining process, and then a 2×2 sub-sampling is achieved. Of course, before transforming color, combining the same colors on macro-pixles of CyYeMgG (by method for averaging signals) instead of full image sampling method can be carried out to achieve more times of sub-sampling during the second process. It is obvious that the macro-pixles of CyYeMgB in the Figure also can be replaced by macro-pixels of BRGB similar to the Bayer pattern. Here CyYeMgB is used as an example, similarly, CyYeMgB, CyYeMgG, CyYeMgR can all be used to get YUV or reconstruct RGB, i.e., CyYeMgG is just a special case of CyYeMgX, wherein X can be R, G or B.

Figure 24:
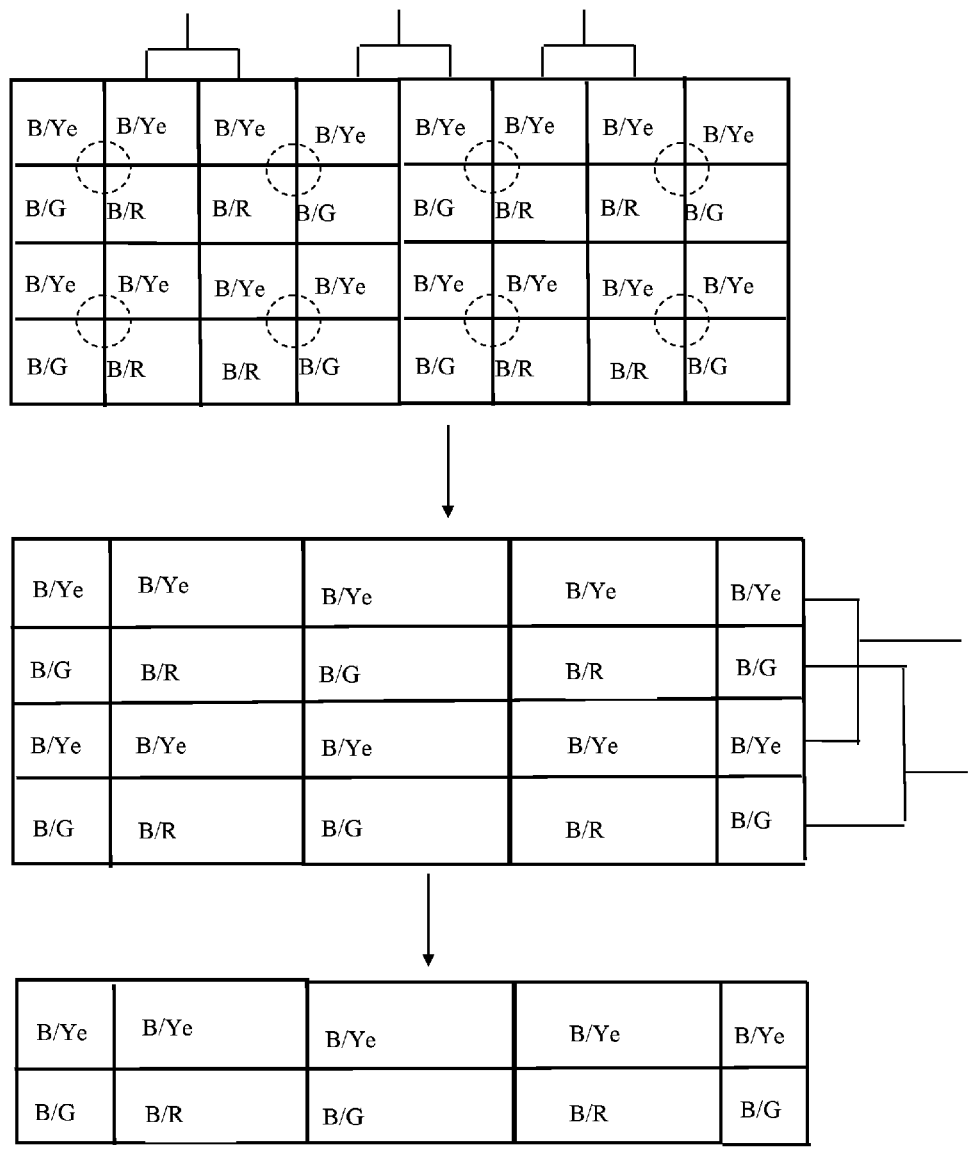

FIG. 24 illustrates another simplified treatment situation for the double-layer photosensitive device during sub-sampling: adjacent pixels are combined (with method for averaging or summing signals) in horizontal direction in the first combining process, and then the combined pixels are further combined (with method for averaging or summing signals, or ignoring rows) in vertical direction in the second combining process. The combinations in horizontal and vertical directions can be simultaneously executed through a suitable time sequence control. This kind of sub-sampling method is not only more versatile than the existing sub-sampling method, but also can provide much better SNR.

Figure 25:
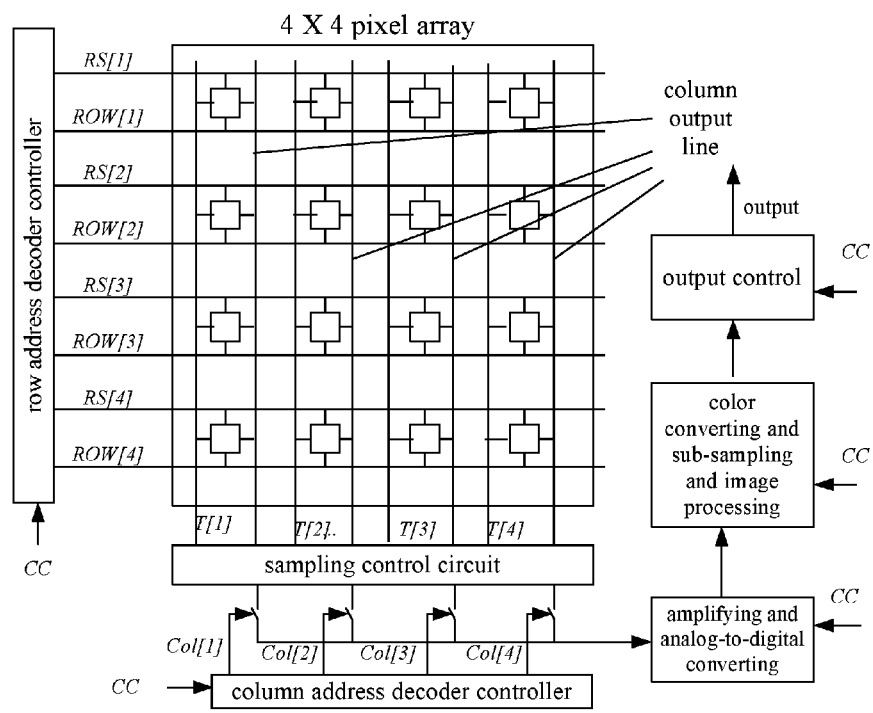

FIG. 25 illustrates a principle system block schematic of a circuit for reading and sub-sampling pixels that implements the present application, which is used to describe the implementation for various functional modules in photosensitive devices of the application. The principle system comprises a pixel array, a row address decoder controller, a column address decoder controller, a sampling control circuit, an amplifying and analog-to-digital converting module, a color converting and sub-sampling and image processing module, an output control module, a main chip control module (CC module in FIG. 25), and other possible modules. The pixel reading and sub-sampling are achieved by corresponding control signals generated by the row and column address decoder controllers (a row selection signal Row[i], a row control vector signal RS[i], a column selection signal Col[j], and a column control vector signal T[j], wherein i and j indicate row number and column number respectively). Cooperation of other modules in the system is mainly achieved by the main chip control module. A third combined sampling process, if it exists, will be accomplished in the color converting and sub-sampling and image processing module.

Figure 26:
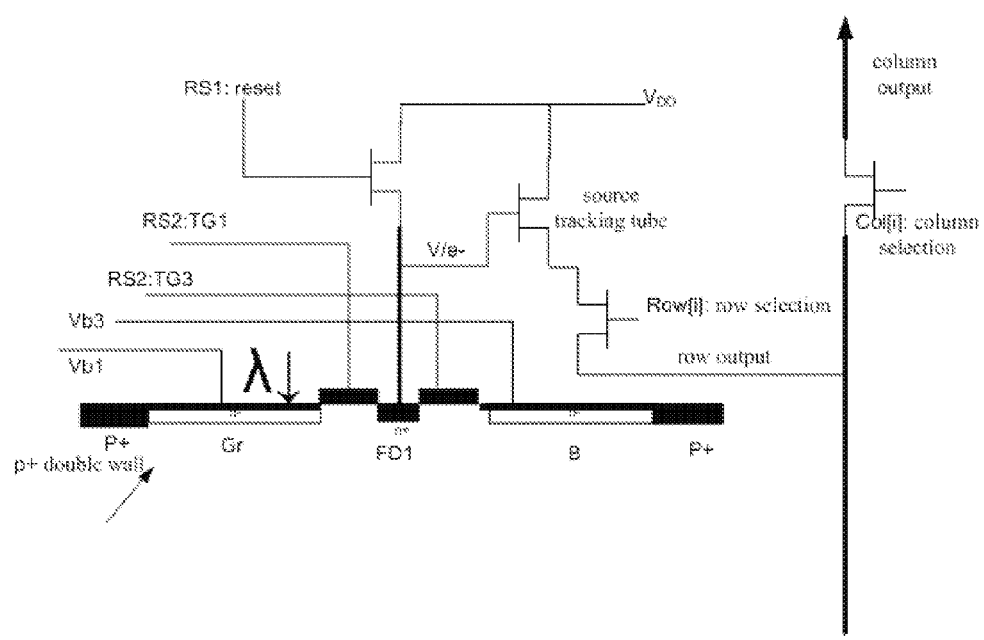

FIG. 26 illustrates a relationship between each of the control signals shown in FIG. 25 (row selection, row control vector, column selection, column control vector) and control signals in corresponding photosensitive pixels by means of a particular example (the photosensitive pixel shown in FIG. 17). FIG. 26 illustrates signals shared by both pixels Gr and B (TG5 is omitted) shown in FIG. 17, wherein row selection signals Row[i] and Col[j] have been denoted clearly. In this circuit, a reset signal RS1 and a transfer gate control signal RS2 (TG1 or TG3) are row control signals. Note that, RS1 is shared by two rows while RS2 is used in each row (e.g., TG1 belongs to RS[i], while TG3 belongs to RS[i+1]). However, TG5 (which is omitted in FIG. 26) shown in FIG. 17 is a column control signal T[j]. That is, try to perform only row operations (same operations for pixels in a same row) and column operations (same operations for pixels in a same column) but not pixel-based operation (different operations for different pixels) as much as possible, so as to decrease complexity.

The methods for sampling and sub-sampling according to the present application will be illustrated in the following embodiments with reference on FIGS. 25 and 26.

DETAILED DESCRIPTION

In a multi-spectrum photosensitive device according to the embodiments of the present application, different circuits for reading and sub-sampling may be implemented by a circuit similar to the circuit shown in FIG. 25, comprising: a pixel array including a plurality of macro-pixels, a row address decoder controller, a column address decoder controller, a sampling control circuit, an amplifying and analog-to-digital converting module, a color converting and sub-sampling and image processing module, an output control module, a main chip control module (e.g. CC module in FIG. 25), and other possible modules.

According to needs, macro pixels based on four pixels or three pixels are arranged in square or honeycomb patterns at first. These pixels may be active pixels, passive pixels, pixels having a reading capacitor (FD), or pixels without a reading capacitor (FD).

In the foregoing, the sub-sampling process has been divided into a first, a second, and an optional third combining-and-sampling process. A first, second, and third combining units corresponding to these processes respectively are employed to implement the above-mentioned combining-and-sampling processes. Certainly, these units are modules of the device just divided from the perspective of functions. Physically, these function units may be implemented in one physical module functionally, implemented in a combination of a plurality of modules, or integrated in a physical module. In a word, the first, second, and third combining units are only functionally described herein. The description thereof does not intend to limit their physical implementation.

Particularly, in the example as shown in FIG. 12, a row address decoder controller and a column address decoder controller are used to implement the sub-sampling function. The row address decoder controller will output two kinds of signal, i.e., a row selection signal Row[i] (one line in each row) and a row control vector signal RS[i] (one or more lines in each row), wherein i denotes a row number. Similarly, the column address decoder controller will output two kinds of signal, i.e., a column selection signal Col[j] (one line in each column) and a column control vector signal T[j] (one or more lines in each column), wherein j denotes a column number.

The row selection signal Row[i] is used for selecting a row, while the column selection signal Col[j] is used for selecting a column. These are two sets of relatively standard signals. Row selection signal Row[i] is an expansion of existing CMOS row control signal (from a line in each row to a plurality of lines in each row), while column control vector signal T[j] does not exist in some CMOS photosensitive devices at all, even if it does, only one signal in one column. FIG. 26 shows a specific implementation of Row[i], RS[i], Col[j], and T[j] based on the photosensitive pixels shown in FIG. 17, wherein Row[i] is shared by two rows, while RS[i] includes row control signals RS1[i] (which is a reset signal, shared by two rows as well) and RS2[i] (which is a charge transfer control signal).

In the present application, it is possible to simultaneously select several rows, several columns, or several rows and columns. Although several rows or several columns are selected simultaneously in some previous technologies (such as U.S. Pat. Nos. 6,801,258B1, 6,693,670B1, 7,091,466B2, 7,319,218B2, and etc.), the time sequences and waveforms of the row selection signal and the column selection signal are different due to different combining-and-sampling methods. For example, during the combining-and-sampling in FIG. 14(*a*), the first row first column and the second row second column of the first row are selected simultaneously. This situation never occurs in the sub-sampling method in the prior arts.

RS[i] and T[j] are used to control the reset, zero clearing, photosensitive time control, charge transfer, combination, and read out of photosensitive pixels. There are many kinds of specific implementations for RS[i] and T[j] due to the symmetry property of row and column. The signals TG1-TG5, $V_{b1}$-$V_{b4}$ and etc. shown in FIG. 17, as well as signals RS, S, and SF shown in FIG. 18 may be included in RS[i] and T[j], and the present application should not be limited in the specific implementations of these signals.

More particularly, during sub-sampling with any M×N factors (M≥2, N≥2), a first combining-and-sampling process in which two rows, or two columns, or two rows and two columns are combined and sampled is performed at first, and then a sub-sampling of M rows×N columns is performed based on the first combining-and-sampling process.

The sub-sampling after the first combining-and-sampling process, i.e., a second combining-and-sampling process, may be performed by any one or combination of the following ways: automatic averaging signals output to a bus directly, row skipping or column skipping, or one by one sampling. However, a third combining-and-sampling process, if any, may be accomplished by one or combination of the following two ways: color space converting and backend digital image scaling.

It is known that there are quite a lot of photosensitive pixels in a pixel array. Especially for a double-layer or multi-layer photosensitive device, there are many types and geometric distributions of colors. Obviously, the first combining-and-sampling process is directed to a plurality of first combined pixels. Thus during the first combining-and-sampling process, color selections for combining these first combined pixels are various from the perspective of color combining of pixel, including combining same color, combining different colors, hybrid combining (some pixels have the same color, and the others have different colors), or selectively abandoning redundant colors Color space conversion includes a conversion from RGB to CyYeMgG space, a conversion from CyYeMgG to YUV space, and a conversion from RGB to YUV space.

It should be noted that the conversion from RGB to CyYeMgG space may be accomplished in an analogue signal space or in a digital space. Therefore, this conversion may be performed in any one of the first, the second, or the third combining-and-sampling process. However, the conversions from CyYeMgG to YUV space and that from RGB to YUV space may only be accomplished in a digital signal space, i.e., in the third combining-and-sampling process.

More particularly, a pixel array consists of a plurality of macro-pixels, each of which comprises three or four basic pixels, wherein the basic pixels are arranged in square pattern. The basic pixels in a macro-pixel may be passive pixels, or 3T active pixels without FD, or 4T active pixels with FD.

If the basic pixels of macro-pixel are 4T active pixels with FD, a reading circuit therewith may employ 4-point sharing mode (FIG. 11), 6-point sharing mode (FIG. 12) and 8-point sharing mode (FIG. 13).

More preferably, each macro-pixel can be comprised of 4T active pixels having two opaque FDs, and the reading circuit therewith can employ 4-pixel bridge sharing mode (as shown in FIG. 18). Correspondingly, the photosensitive devices employ charge superposition method during color combining when sub-sampling with two rows or two columns, or two rows and two columns at first time. This kind of macro-pixel provides possibilities for the following progressive scanning interlaced or skipping sampling a full image.

For a double-layer or multi-layer photosensitive device, besides more abundant color selection in the first combining-and-sampling process, when each macro-pixel can be comprised of 4T active pixels having two opaque FDs, the reading circuit therewith can employ 4-pixel bridge sharing mode (FIG. 18), 6-pixel bridge sharing mode (FIG. 19), or 8-pixel bridge sharing mode (FIG. 20). Correspondingly, the photosensitive devices employ charge superposition method during color combining when sub-sampling with two rows or two columns, or two rows and two columns at first time.

It should be noted that the upper limit of SNR improvement is N $\sqrt{N}$ times when N signals are combined by applying charge superposition, while the upper limit of SNR improvement is $\sqrt{N}$ times when N signals are combined by signal averaging. Secondly, when full-image sampling is performed in this photosensitive device in which four-point are shared by two FD (or a FD is shared by pixels in two rows), a progressive scanning interlaced reading mode may also be used in addition to a normal progressive scanning progressive reading mode.

For example, during full image sampling, according to requirements of demanded image region, the row address decoder controller and column address decoder controller will firstly set values of Row[i] and RS[i] successively to high or low and secondly set values of Col[j] and T[j] successively to high or low upon agreed by devices, such that the required value of pixels (charge/voltage) can be output to an output bus (through a read/write circuit) in accordance with reading order.

During sub-sampling, for each supported M×N sampling factor (by which a row is to be reduced by M times, and a column is to be reduced by N times), according to the sampling factor M×N and the image area requirement, a row address decoding controller and a column address decoding controller set values of all Row[i] and RS[i] of the rows, which are needed to be combined corresponding to each output row, to high or low simultaneously, and then set values of all Col[j] and T[j] of the columns, which are needed to be combined corresponding to each output column, to high or low simultaneously, such that values (charge/voltage) of all pixels to be combined can be output to an output bus (via a reading circuit) in accordance with reading order. Meanwhile, if necessary, the row address decoding controller and the column address decoding controller also perform necessary operation of row or column skipping or abandon redundant colors according to the sampling factor M×N and the image area requirement.

For different M×N sampling factors, different colors may be obtained on the output bus in different times. Accordingly, other functional modules, such as the amplifying and analog-to-digital conversion module, the color converting and sub-sampling and image processing module, and the output control modules may be needed to be coordinated correspondingly. The total control of this system may be performed by a main chip control module (as the CC module in FIG. 25). It should be noted that most modules, except the amplifying and analog-to-digital conversion module and the pixel array are digital process circuits, and thus may be implemented in the peripheral of devices easily so that the wiring of photosensitive device is simplified.

Hereinafter a more specific flow of signal control will be given in conjunction with the reading circuit shown in FIG. 26 and the other modules of photosensitive device shown in FIG. 25, wherein the reading circuit shown in FIG. 26 is used by the photosensitive pixels shown in FIG. 17.

Firstly, reset and sensing control is performed: one simple method for reset control is to set Vb1 and Vb2 to zero, wherein Vb1 and Vb2 are signals of row control vector. Another method is that FD1 and FD2 are reset firstly (i.e., RS1 is set to zero in FIG. 26), and TG1 and TG2 are opened simultaneously (i.e., RS2 is set to high level in FIG. 26) to remove charges in the Gr and R of photosensitive pixel. Then, RS1 is set to high level, while RS2 is set to zero. Under irradiation of light, the photodiodes of Gr and R then begin the accumulation of charge.

There are three methods for reading charges of Gr. A first method is that TG1/RS2 and Row[i] are opened directly, charges of Gr are transferred into FD1, and then (through a conversion from charge to voltage) the charge value of Gr is read out. A second method is that after the charge value of Gr is read out in the last step of the first method, FD1 is reset and the charge (voltage) of FD1 in the reset state is read out, so as to performing cross-sampling for the charge value of the read out Gr. A third method is that before charge value of Gr is read out, FD1 is reset sampled at first. The third method is not as good as the second method because it will disturb the value of Gr. Here, the column selecting signal Col[j] corresponding to Gr should be opened by the column address decoder controller so as to output the measurement of Gr (may be measured by twice, one of which is under the reset state) to the amplifying and analog-digital conversion module.

According to the values of Row[i], Col[j] and RS2[i], the main chip control module CC may work out the colors of pixels being read out and make a corresponding process to the colors. Different colors may be entered into different amplifying circuits and performed by different analog-digital conversion processes thus obtaining digital signals.

The digital signals of photosensitive pixels will be stored in a buffer and further processed by the color conversion and sub-sampling and image processing module. In the case of full image sampling, no sub-sampling is performed and generally no color conversion is performed for large-array image sensing devices. Therefore, the main chip control module CC may conduct corresponding control under this mode, so that the digital signals of photosensitive pixels may go directly into the image process module instead of the color conversion and sub-sampling module. Following image processing in photosensitive devices, the digital signals may be output to an external interface of the photosensitive device via an output module.

During full-image sampling, the progressive scanning interlaced reading or skipping reading mode should be noted. In this case, reset and photosensitive time control in odd and even rows may be conducted simultaneously. During interlaced reading, after pixels in even rows (the first row) have been read out completely, the row address decoder controller does not immediately read the next row but transfers pixels in the next odd row (the second row) to the FDs which are shared by the even row, and then begins to read the third row. During skipping reading, if the first row is numbered from 0, a reading order of rows of the former half frame is 0, 3, 4, 7, 8, 11, 12, 15, . . . , while that of latter half frame is 1, 2, 5, 6, 9, 10, 13, 14, . . . . There may be also more complicated orders. For example, the row which is not read during reading the first half frame is temporally stored in the FD which has been used once, and will be read out until the last half frame is read.

The difference between the method of progressive scanning, interlaced or skipping reading and the traditional field scanning method adopted in televisions is that the time sequence of pixels is completely row by row in the method of progressive scanning, interlaced or skipping reading according to the present application.

It is more complex during sub-sampling, but it is possible that only few M×N sub-sampling factors are supported for a specific photosensitive device. Accordingly, the main chip control module CC, the row address decoding controller, and the column address decoding controller may only consider the supported M×N sub-sampling factors. For example, a 5-million-pixel photosensitive device may only consider four cases of 2×2, 2×1, 4×4, and 8×8.

The second combining-and-sampling process generally does not involve charge superposition, and the following three ways are usually applied: automatic averaging of signals output directly to a bus, row skipping or column skipping, or one by one sampling. The three ways are conventional and simple, and are well known for those skilled in the art. Thus the description thereof will be omitted. The third combining-and-sampling process may be accomplished in digital image space by employing digital image scaling technology which is relative standard. The signal control flow of the first combining-and-sampling process will only be described in detail in the following in order to make the use method of the application more apparent.

For macro-pixels as shown in FIG. 17, there are two combining methods in the first combining process, one is one is combining Gr with B and combining R with Gb; the other one is combining Gr with Gb, and combining R with B.

For the first combining method, according to the time sequence:

1. Time t0: RS1 corresponding to FD1 as shown in FIG. 26 will be set to zero (reset) by the row address decoder controller.

2. Time t1: TG1 and TG3 (RS2[i] and RS2[i+1]) are opened, while charges of photosensitive diodes (PD) Gr and B are transferred into FD1 respectively at the same time. Here, RS1 may be set to high level.

3. Time t2: Row[i] and Col[j] are opened (assuming that Gr is at the ith row and jth column charge (voltage value) of FD1 is output to the output bus.

4. Time t3: the zero value of FD1 may be read out to be used for correlated sampling.

All pixels in the ith and (i+1)th rows may be performed the first two steps (i.e., at the Times t0 and t1) simultaneously, and the combined pixels may be read out in turn in the third and fourth steps (i.e., at the Times t2 and t3). Therefore, one pixel may be read out per one clock pulse on average without correlated sampling; otherwise, if performing correlated sampling, one pixel may be read out per two clock pulses on average. This is conducted according to the priority of pixel position. The combining method may be applied according to the following color priority.

For the second combining method, the time sequence is more complicated. There are two processing methods, one is based on color priority, that is, firstly combining and sampling of Gr and Gb in a whole row, and then combining and sampling B and R, or in reverse order. This is a simple method, and the time sequence of control signal is as follows:

5. Time t0: RS1 corresponding to FD1 and FD2 as shown in FIG. 17 and FIG. 26 will be set to zero (reset) by the row address decoder controller.

6. Time t1: TG1 and TG4 (RS2[i] and RS2[i+1]) are opened, while charges of photosensitive diodes (PD) Gr and B are transferred into FD1 respectively at the same time. Herein, RS1 may be set to high level.

7. Time t2: TG5 is opened, and charge of FD2 is transferred into FD1.

8. Time t3: then Row[i] and Col[j] are opened (assuming that Gr is at the ith row jth column), and charge (voltage value) of FD1 is output to the output bus.

9. Time t4: the zero value of FD1 may be read out to be used for correlated sampling.

All pixels in the ith and (i+1)th rows may be performed the first three steps (i.e., at the Times t0, t1 and t2) simultaneously, and the combined pixels may be read out in turn in the fourth and fifth steps (i.e., at the Times t0, t1 and t2). Therefore, one pixel may be read out per one clock pulse on average without correlated sampling; otherwise, if performing correlated sampling, one pixel may be read out per two clock pulses on average. The reading method breaks down the natural order according to positions of pixel and a backend processing correction is needed. In order to keeping consistency, the first combining method may be conducted according to color priority.

The second processing method is based on position priority: the combining-and-sampling of a first Gr and Gb is completed at first, and then that of a first B and R is conducted, and so repeatedly. The time sequence of this kind of signal control is similar to that of the first processing method, while serial processing may be performed between pixels instead of parallel processing. That is, the second combined pixel cannot be processed during Times t0-t5 of processing the first combined pixel. This needs a system clock with higher frequency. It is lucky that the number of pixels will be decreased after sub-sampling. Therefore, the frequency of the system clock might not be ridiculously high.

For the preferred circuit of the present application, during sub-sampling, correlated sampling may be omitted due to its limited effect. Therefore, the above-mentioned time sequence will be simpler.

For the selected pixel sampling order, the main chip control module CC may control the amplifying and analog-to-digital conversion module correspondingly to transfer different colors through different amplifier circuits to the color conversion and sub-sampling and image process module, as well as the output control module, so that different colors may be processed differently. The description in more detail goes beyond the scope of the present application.

The prior sub-sampling is mainly carried out between pixels of the same color, and mainly achieved by pixel averaging and row skipping or column skipping operations. These methods may not work for dual-photosensitive devices or multi-photosensitive devices. The sub-sampling method proposed in the present application may be carried out by the way of color space conversion between pixels of the same color or of different colors. Alternatively, the sub-sampling method proposed in the present application may be carried out in hybrid (i.e., sub-sampling is partially performed between some pixels of the same color, and partially performed between other pixels of different colors). Moreover, according to the signal combining of charge superposition proposed in the present application, the effect of summing $N^3$ signals may be almost achieved by combining only N signals. Therefore, the sub-sampling method in the present application will produce higher image quality compared to a typical sub-sampling method in the prior art. In particular, when the present application is employed for double-layer photosensitive devices or multi-layer photosensitive devices, a large number of simple and excellent sub-sampling ways will be generated.

The aforesaid description is provided for illustrating the spirit and scope of the present application by single-layer and double-layer photosensitive devices and some 3T/4T active pixels. These specific conditions are not intended to limit the present application. Rather, if the present application is used for more complicated designs, such as 5T/6T active pixels or a multi-layer photosensitive device, the advantageous effects will be more apparent.

The invention claimed is:

1. A multi-spectrum photosensitive device, comprising:
a pixel array arranged in row and column;
first combining units, each adapted for combining-and-sampling two neighboring pixels in the pixel array which are in a same row but different columns, or in different rows but a same column, or in different rows and different columns to obtain sampling data of a first combined pixel, wherein at least one of the first combining units is adapted for combining pixels with different colors; and
second combining units, each adapted for combining-and-sampling the sampling data of the first combined pixels obtained in the first combining units to obtain sampling data of a second combined pixel,
wherein the way of combining of the first or second combining unit is a charge superposition between pixels with same or different colors or a signal averaging of pixels with different colors, wherein pixels with different colors are combined according to color space conversion.

2. The multi-spectrum photosensitive device of claim 1, further comprising a third combining unit adapted for combining-and-sampling the sampling data of the second combined pixels obtained in the second combining units to obtain sampling data of a third combined pixel.

3. The multi-spectrum photosensitive device of claim 2, wherein the third combining unit is performed by at least one of color space conversion and backend digital image scaling; the color space conversion includes a conversion from RGB to CyYeMgX space, a conversion from RGB to YUV space, or a conversion from CyYeMgX to YUV space, wherein X is any one of red, green and blue.

4. The multi-spectrum photosensitive device of claim 1, wherein the charge superposition is accomplished in a reading capacitor.

5. The multi-spectrum photosensitive device of claim 1, wherein combining-and-sampling performed in the first or the second combining unit includes same-color combining, different-color combining, hybrid combining, or selectively abandoning redundant colors, and at least one of the first and the second combining unit is not performed by the same-color combining.

6. The multi-spectrum photosensitive device of claim 1, wherein combining-and-sampling performed in the first or the second combining unit includes at least one of automatic averaging of signals output directly to a bus, row skipping or column skipping, and one-by-one sampling.

7. The multi-spectrum photosensitive device of claim 1, wherein the pixel array consisted of a plurality of macro-pixels each including at least one basic pixel, wherein the basic pixel is a passive pixel or an active pixel.

8. The multi-spectrum photosensitive device of claim 7, wherein the basic pixels of the pixel array are arranged in a square pattern or a honeycomb pattern.

9. The multi-spectrum photosensitive device of claim 7, wherein the macro-pixel is consisted of at least of one of the following: a 3T active pixel without a reading capacitor and a 4T active pixel with one reading capacitor.

10. The multi-spectrum photosensitive device of claim 9, wherein the 4T active pixel with one reading capacitor employs a reading circuit which adopts a 4-pixel sharing mode, or 6-pixel sharing mode, or 8-pixel sharing mode.

11. The multi-spectrum photosensitive device of claim 7, wherein the macro-pixel is consisted of four pixels arranged in the square pattern and two opaque reading capacitors located between two rows, wherein one reading capacitor is shared by pixels in a preceding row and pixels in a next row, charges are transferred between the two reading capacitors, and at least one of the reading capacitors is connected to a reading circuit.

12. The multi-spectrum photosensitive device of claim 7, wherein the macro-pixel is consisted of at least one basic pixel having a 3T or 4T active pixel with a reading capacitor shared by two points, three points, or four points, wherein the basic pixel employs a reading circuit which adopts a 4-points bridge sharing mode, or a 6-points bridge sharing mode, or a 8-points bridge sharing mode.

13. A sampling method for a multi-spectrum photosensitive device, comprising:
a first combining process for combining-and-sampling two neighboring pixels in the pixel array which are in a same row but different columns, different rows but a same column, or different rows and different columns to obtain sampling data of first combined pixels, including combining of pixels with different colors; and
a second combining process for combining-and-sampling the sampling data of the first combined pixels obtained in the first combining process to obtain sampling data of second combined pixels,
wherein the way of combining of the first or second combining unit is a charge superposition between pixels with same or different colors or a signal averaging of pixels with different colors, wherein pixels with different colors are combined according to color space conversion.

14. The sampling method of claim 13, further comprising a third combining process for combining-and-sampling the sampling data of the second combined pixels obtained in the second combining process to obtain sampling data of a third combined pixel.

15. The sampling method of claim 14, wherein the third combining process is performed by at least one of color space conversion and backend digital image scaling; the color space conversion includes a conversion from RGB to CyYeMgX space, a conversion from RGB to YUV space, or a conversion from CyYeMgX to YUV space, wherein X is any one of red, green and blue.

16. The sampling method of claim 13, wherein combining-and-sampling performed in the first combining process or the second combining process includes same-color combining, different-color combining, hybrid combining, or selectively abandoning redundant colors, and at least one of the first and the second combining processes is not performed by the same-color combining.

17. The sampling method of claim 13, wherein combining-and-sampling performed in the first or the second combining process includes at least one of automatic averaging of signals output directly to a bus, row skipping or column skipping, and one-by-one sampling.

18. The sampling method of claim 13, wherein full-image sampling is performed by progressive scanning progressive reading or progressive scanning interlacing reading.

* * * * *